United States Patent
Jacobson

(10) Patent No.: US 7,839,201 B2
(45) Date of Patent: Nov. 23, 2010

(54) INTEGRATED SMART POWER SWITCH

(75) Inventor: Boris S. Jacobson, Westford, MA (US)

(73) Assignee: Raytheon Company, Waltham, MA (US)

( * ) Notice: Subject to any disclaimer, the term of this patent is extended or adjusted under 35 U.S.C. 154(b) by 1031 days.

(21) Appl. No.: 11/098,033

(22) Filed: Apr. 1, 2005

(65) Prior Publication Data

US 2006/0221527 A1    Oct. 5, 2006

(51) Int. Cl.
  *H01L 35/00* (2006.01)
(52) U.S. Cl. ........................ 327/513; 327/512
(58) Field of Classification Search ......... 327/509–513; 361/93.2
  See application file for complete search history.

(56) References Cited

U.S. PATENT DOCUMENTS

| | | | |
|---|---|---|---|
| 5,187,632 A * | 2/1993 | Blessing | 361/103 |
| 5,397,978 A | 3/1995 | Parry et al. | |
| 5,444,590 A | 8/1995 | LeComte et al. | |
| 5,497,072 A | 3/1996 | LeComte et al. | |
| 5,567,993 A | 10/1996 | Jones et al. | |
| 5,684,663 A | 11/1997 | Mitter | |
| 5,687,049 A | 11/1997 | Mangtani | |
| 5,723,915 A | 3/1998 | Maher et al. | |
| 5,898,557 A | 4/1999 | Baba et al. | |
| 5,932,938 A * | 8/1999 | Shimamori | 307/125 |
| 5,946,181 A | 8/1999 | Gibson | |
| 5,959,926 A | 9/1999 | Jones et al. | |
| 6,052,268 A | 4/2000 | Thomas | |
| 6,057,728 A | 5/2000 | Igarashi | |
| 6,125,024 A | 9/2000 | LeComte et al. | |
| 6,151,681 A | 11/2000 | Roden et al. | |

(Continued)

FOREIGN PATENT DOCUMENTS

DE    3832273 A1    3/1990

(Continued)

OTHER PUBLICATIONS

Richard Frey, P.E., Denis Grafham, Tom Mackenzie, Advanced Power Technology, New 500V Linear MOSFETs for a 120 kW Active Load, PCIM 2000, Jun. 7, 2000, pp. 1-7, Nuremberg, Germany.

(Continued)

*Primary Examiner*—Dinh T. Le
(74) *Attorney, Agent, or Firm*—Daly, Crowley, Mofford & Durkee, LLP

(57) ABSTRACT

A device including a controllable semiconductor, sensor, and controller is provided. The controllable semiconductor is associated with a first operating parameter and a second operating parameter, wherein at least the first operating parameter is controllable. The sensor is in communication with the controllable semiconductor device and acquires data relating to the second operating parameter of the controllable semiconductor device. The controller is in communication with the controllable semiconductor device and the sensor, and the controller is configured to access device data associated with the controllable semiconductor, control the first operating parameter of the controllable semiconductor, and receive data from the first sensor relating to the second operating parameter. The controller determines a first predicted value dependent on the device data, compares the data relating to the second operating parameter with the first predicted value, and, if a first condition is detected based on this comparison, dynamically modifies the first operating parameter.

35 Claims, 13 Drawing Sheets

U.S. PATENT DOCUMENTS

| | | | |
|---|---|---|---|
| 6,169,309 B1 | 1/2001 | Teggatz et al. | |
| 6,169,439 B1 | 1/2001 | Teggatz et al. | |
| 6,172,861 B1 | 1/2001 | Ohta | |
| 6,222,236 B1 | 4/2001 | Lamey | |
| 6,222,745 B1 | 4/2001 | Amaro et al. | |
| 6,300,146 B1 | 10/2001 | Thierry | |
| 6,307,726 B1 | 10/2001 | Marshall et al. | |
| 6,348,744 B1 | 2/2002 | Levesque | |
| 6,366,153 B1 * | 4/2002 | Arslain et al. | 327/512 |
| 6,476,667 B1 | 11/2002 | Teggatz et al. | |
| 6,486,523 B2 | 11/2002 | Tomomatsu | |
| 6,530,064 B1 | 3/2003 | Vasanth et al. | |
| 6,608,791 B2 | 8/2003 | Watanabe et al. | |
| 6,667,532 B2 | 12/2003 | Haupt et al. | |
| 6,667,738 B2 | 12/2003 | Murphy | |
| 6,678,829 B1 | 1/2004 | Teggatz et al. | |
| 7,164,310 B1 * | 1/2007 | Nauleau et al. | 327/540 |
| 2003/0067955 A1 | 4/2003 | Butchers et al. | |
| 2004/0095023 A1 | 5/2004 | Jacobson et al. | |
| 2004/0257271 A1 | 12/2004 | Jacobson et al. | |
| 2004/0257272 A1 | 12/2004 | Jacobson | |
| 2005/0045879 A1 | 3/2005 | Ausserlechner | |

FOREIGN PATENT DOCUMENTS

| | | |
|---|---|---|
| EP | 0199754 | 10/1985 |
| EP | 0 399 754 A2 | 11/1990 |
| EP | 0 479 362 A2 | 4/1992 |
| EP | 0 479 362 A3 | 4/1992 |
| EP | 1 357 461 | 10/2003 |
| EP | 1 357 461 A2 | 10/2003 |
| EP | 1 357 461 A3 | 10/2003 |
| EP | 1 357 461 A3 | 6/2006 |
| GB | 2 315 172 A | 7/1997 |
| WO | WO 2005/022747 A1 | 3/2005 |

OTHER PUBLICATIONS

Ben Ames, Power Control Is Trickier Than It Used to Be, Military and Aerospace Electronics, Jul., 2004, pp. 22-27.

Ashok Bindra, Controller With Programmable Power and Current Limits, Power Electronics Technology, Jan., 2004, p. 62.

Fairchild Introduces the First Intelligent Power Switch Integrating A Low Current IC and a P-Channel MOSFET for Slew Rate Control Up to 3A, Jul. 10, 2003, printed on Feb. 25, 2005 from http://www.fairchildsemi.com/news/2003/0307/FDC6901L.html.

IR International Rectifier, Programmable Current-Sensing High Side Power Switches IR3310/11/12, pp. 1-2, printed on Feb. 25, 2005 from http://www.irf.com/product-info/auto/autoir31x.html.

IR International Rectifier, Ultra-Low Rds(on) Self-Protected Intelligent Power Switches, pp. 1-3, printed on Feb. 25, 2005 from http://www.irf.com/product-info/auto/ips.html.

PCT/US2006/010114 International Search Report dated Jan. 25, 2007.

PCT/US2006/010114 Partial International Search Report dated Sep. 1, 2006.

PCT/US2006/010114 Invitation to Pay Additional Fees.

Office Action dated Sep. 2, 2008 for Australian Application No. 2006232963, filed Jul. 23, 2007, 2 pages.

Response to Office Action dated May 27, 2008 filed on Dec. 8, 2008 for European Patent Application No. 06739053.4-1233, 37 pages.

Response to Office Action re Israel Patent Application No. 184796, filed Jul. 23, 2007, 2 pages.

Letter from EP Associate dated Jun. 11, 2008 reporting and enclosing European Examination Report for co-pending case in Europe, 4 pages.

Letter from EP associate dated Dec. 8, 2008 reporting and enclosing response to European Examination report, 39 pages.

Office Action dated Feb. 4, 2009 from U.S. Patent Office, U.S. Appl. No. 11/098,033, filed Apr. 1, 2005 (no rejections over art), 7 pages.

Response to U.S. Office Action dated May 4, 2009, 28 pages.

Notice of allowance dated May 20, 2009 from U.S. Patent Office (note that RCE subsequently was filed to ensure all art before USPTO, so no issue yet), 7 pages.

Request for Continued Examination (RCE) filed in US patent office, together with Information Disclosure Statement (IDS), including citation of Australian Examination Report, filed Jun. 26, 2009, 16 pages.

Information Disclosure Statement filed Jul. 13, 2009 in US Patent office, to cite to US the above-listed EP Associate Report and its response, 53 pages.

Letter to Australia Associate dated Aug. 24, 2009 providing comments, response, and claim amendments for outstanding AU Examination report, 24 pages.

Chinese Office Action dated Jun. 25, 2009 of Chinese Patent Application 200680010862.6 counterpart of PCT/US2006/010114, filed on Mar. 21, 18 pages.

Office Action Response dated Sep. 30, 2009 for Australian Patent Application No. 2006232963 filed Mar. 21, 2006, 48 pages.

Australian Patent Office Notice of Acceptance Date: Nov. 9, 2009, Serial No. 2006232963, 3 pages.

Office Action Response dated Sep. 7, 2009 for Israel Patent Application No. 184796 filed Mar. 21, 2006, 2 pages.

Chinese Office Action Response with amended claims as filed Mar. 2, 2010, Chinese Patent Application 200680010862.6.

Second Chinese Office Action dated Mar. 29, 2010 of Chinese Patent Application 200680010862.6, filed Sep. 29, 2007 (counterpart of PCT/US2006/010114 filed Mar. 21, 2006), 32 pages.

Applicant's letter sent to Chinese Associate with claim amendments and arguments on $2^{nd}$ office action for Chinese Patent Application No. 200680010862.6; 21 pages.

English translation of claim amendments filed in RTN-219PCN $1^{st}$ office action for Chinese Patent Application No. 200680010862.6; 9 pages.

English translation of written response to $1^{st}$ Chinese office action for Chinese Patent Application No. 200680010862.6; 10 pages.

Letter dated Aug. 23, 2010 with response to Office Action filed in Chinese Patent Appl. No. 200680010862.6, filed Sep. 29, 2007, 19 pages.

* cited by examiner

INTEGRATED SMART POWER SWITCH

CROSS REFERENCE TO RELATED APPLICATIONS

Not applicable

STATEMENT REGARDING FEDERALLY SPONSORED RESEARCH

Not Applicable.

FIELD OF THE INVENTION

Embodiments of the invention generally relate to semiconductors and systems. More particularly, the invention relates to systems, methods, and devices for operating, controlling, and monitoring power semiconductors and systems.

BACKGROUND OF THE INVENTION

Power semiconductor devices are well known to those of ordinary skill in the art and are commonly used for electronic power conversion, regulation, and control. As building blocks of power systems, power semiconductor devices operate in both a switching mode and a linear mode. Power semiconductors satisfy such conflicting requirements as low weight and volume, high circuit-level reliability, fault isolation, and diagnostic capabilities.

Power transistors are a type of power semiconductor that is used in a variety of applications in the power range from watts to megawatts. While the majority of applications use power semiconductors in switched mode, other applications require devices to operate in the linear region. Such applications include constant-current capacitor charging and discharging, gradual voltage build up at the load ("soft start"), and switching of inductive loads.

For example, an application for a controlled mode power system can be found in "Intelligent Power System," Ser. No. 10/692,580, filed Oct. 24, 2003, inventors Boris S. Jacobson et al., published as U.S. 2004/0095023 on May 20, 2004. The contents of this patent application are hereby incorporated by reference.

For example, FIG. 1 shows an example of a transistor Q that works in the linear mode by charging a capacitor bank $C_1$-$C_n$ from a voltage source $V_{in}$, and FIG. 2 is a graph showing parameters for the transistor circuit of FIG. 1. Prior to $t_0$, the transistor blocks the source voltage. At the moment $t_0$ the transistor gradually turns on and starts charging the capacitor bank. During the time interval $t_0$-$t_1$, a linearly decaying voltage is applied to the transistor that conducts constant current. The power dissipated by the transistor is $P=1/(t_1-t_0)\int I\, V(t)\, dt$ where v(t) is the voltage across the transistor, the integration interval is from $t_0$ to $t_1$, and I is the constant current through the transistor.

A problem associated with a type of power transistors known as a metal oxide semiconductor field effect transistors (MOSFETs), as well as with Insulated Gate Bipolar Transistors (IGBTs) is that they can be optimized as switches and cannot sustain continuous power dissipation associated with operation in the linear mode. One reason for this is a phenomenon called hot spotting or current tunneling. For an ideal device, both current density and temperature profile across the die are generally uniform. However, non-uniform doping and voids in the die attachment material can produce variations in the current density and temperature across the device. A transistor gate threshold voltage $V_{th}$ typically has a negative temperature coefficient. Consequently, when some locations of the die (particularly near the center of the die) start running at a higher temperature, $V_{th}$ of these drops and the transistor gain $G_m$ forces a localized increase of current density. The higher current causes further gain increase that ultimately results in the thermal runaway and catastrophic failure of the device. Thus, current tunneling effectively prevents using presently available MOSFETs and IGBTs in linear applications.

For example, FIG. 3 is a graph of transistor gate threshold voltage as a function of temperature, for a transistor such as the transistor Q of FIG. 1. As FIG. 3 shows, the transistor gate threshold voltage $V_{th}$ has negative temperature coefficient. Consequently, when some locations of the die (particularly near the center) start running at a higher temperature, the $V_{th}$ of these locations drops, and the transistor gain $G_m$ forces a localized increase of current density. The higher current causes further gain increase that ultimately results in the thermal runaway and catastrophic failure of the device.

As another example, FIG. 4 is a graph of transistor gate to source voltage versus junction temperature curves for various drain currents, for a transistor such as the transistor of FIG. 1. The value of $I_d$ corresponding to the zero-slope curve in FIG. 4 is called the crossover current $I_{crc}$. One of the most effective methods to improve transistor performance in the linear mode is to reduce its crossover current.

MOSFET devices fabricated using the latest processing techniques tend to have lower gate charge, lower gate to drain charge, and lower on resistance $R_{DSon}$ than the earlier generation devices. For example, Table 1 shows crossover current for three generations of APT5010 MOSFET made by Advanced Power Technology (APT). The APT5010LLC made using the latest MOS VI® process has lower gate charge, lower gate to drain charge, and lower on resistance $R_{DSon}$ than the earlier generation devices. Unfortunately, as switching performance of this device improves, the crossover current increases and its linear operation deteriorates. It can thus be seen that current tunneling effectively prevents using current MOSFETs and IGBTs in linear applications.

TABLE 1

Transistor Crossover Current for Various Processes

| Device | Crossover Current | Process |
| --- | --- | --- |
| APT5010JN | 15 A | MOS IV ® |
| APT5010JVR | 62 A | MOS V ® |
| APT5010LLC | 100 A | MOS VI ® |

Another area where a conventional power semiconductor device can experience problems is in its safe operating area. Generally, a Forward Biased Safe Operating Areas (FBSOA) curve defines the maximum drain voltages and currents a power device can sustain during its turn on or under forward-biased conditions. A Reverse Biased Safe Operating Areas (RBSOA) curve defines the peak drain current and voltage under inductive load turn off when the transistor drain voltage is clamped to its rated drain to source breakdown voltage $BV_{DSS}$. FIG. 5 is an illustrative graph of forward biased safe operating area (FBSOA) curves, and FIG. 6 is an illustrative graph of reverse biased safe operating area (RBSOA) curves.

It might be expected that a transistor has to operate within fixed boundaries of the FBSOA and RBSOA under all conditions. However, the FBSOA and RBSOA curves limit only the maximum drain to source voltage ratings. Otherwise, as opposed to indicating absolute limits for a device, the curves represent areas of "acceptable" reliability often expressed as Mean Time Between Failures (MTBF). Also, the FBSOA curves normally show data for a single current pulse and several different pulse widths at the case temperature of 25° C. Because most applications need continuous operation and higher case temperature, the FBSOA has to be recalculated for every specific case.

As a result, many designs can not tolerate changed environmental or circuit conditions such as operating at a higher junction temperature in an emergency with reduced coolant flow or providing higher current to a stalled motor. One way of providing a power semiconductor device that can tolerate changed environmental conditions is to provide a device that that is oversized for the application. However such oversizing still does not prevent the devices from being underused in one mode of operation and overstressed in another.

At present, power transistors suffer from a lack of diagnostics and prognostics wherein it is difficult to determine if anything is wrong with working power semiconductors. Failed devices can be examined after the fact to determine possible causes of failure. The common prediction method of power transistor reliability relies on the device junction temperature. The prediction method is based on theoretical models and does not take into account either fabrication defects or actual operating conditions. For example, the existing method for predicting power transistor reliability would not account for a device failure caused by overstressed die contact to the substrate or faulty mounting to the heat sink. Further, no methods of inspecting and calibrating installed transistors according to their power handling capability exist at the present time.

SUMMARY OF THE INVENTION

In one embodiment, the invention provides a device comprising a controllable semiconductor device, a first sensor, and a controller. The controllable semiconductor device (e.g., at least one of a power transistor, a static induction transistor (SIT), a thyristor, an MOS-controlled thyristor (MCT), a gate turnoff (GTO) thyristor, and an emitter turnoff (ETO) thyristor) is associated with a first operating parameter and a second operating parameter, wherein at least the first operating parameter is controllable.

The first operating parameter can, for example, comprise at least one of drain to source voltage, collector to emitter voltage, anode to cathode voltage, gate voltage, gate current, base current, average drain device current, average collector device current, average anode device current, peak drain current, peak collector current, peak anode current, RMS drain current, RMS collector current, RMS anode current, die temperature, case temperature, junction temperature ($T_J$), switching frequency, and duty cycle.

The second operating parameter can, for example, comprise at least one of a gate drive, base drive, a transistor bias, a safe operating area (SOA) condition, a drain to source voltage threshold ($V_{DS}$), an RMS drain current threshold ($I_{DRMS}$), a forward and reverse bias safe operating area (SOA) pulse current threshold, ($I_{DM}$), a forward bias SOA drain current ($I_D$) boundary limited by drain to source on resistance ($R_{DS(on)}$), and an operating area of the power device.

The first sensor (e.g., at least one of a temperature sensor, a voltage sensor, and a current sensor) is in communication with the controllable semiconductor device, and the first sensor acquires data relating to the second operating parameter of the controllable semiconductor device. The first sensor can monitor the controllable semiconductor at more than one location. Additional sensors can also be provided, such as sensors acquiring at least one of an environmental condition (e.g., at least one of a temperature, a flow of coolant, and a moisture level) and a mechanical condition (e.g., at least one of stress, strain, force, movement, vibration, acceleration, and shock) affecting the controllable semiconductor.

The controller is in communication with the controllable semiconductor device and the sensor. The controller is configured to access device data associated with the controllable semiconductor, control the first operating parameter of the controllable semiconductor, and receive data from the first sensor relating to the second operating parameter. The controller determines a first predicted value dependent on the device data, compares the data relating to the second operating parameter with the first predicted value, and, if a first condition is detected (e.g., at least one of over-temperature, current tunneling, excessive power, over-current, over-voltage, a coolant problem, a heat sink problem, a die defect, a die interconnect bonding defect, a die attachment defect, and a device package mounting defect) based on this comparison, the controller dynamically modifies the first operating parameter.

In another embodiment, the invention provides a method of operating a controllable semiconductor, the controllable semiconductor in communication with a first sensor. The controllable semiconductor is enabled, and a first operating parameter (e.g., at least one of drain to source voltage, collector to emitter voltage, anode to cathode voltage, gate voltage, gate current, base current, average drain device current, average collector device current, average anode device current, peak drain current, peak collector current, peak anode current, RMS drain current, RMS collector current, RMS anode current, die temperature, case temperature, junction temperature ($T_J$), switching frequency, and duty cycle) is controlled.

A second operating parameter (e.g., at least one of a gate drive, base drive, a transistor bias, a safe operating area (SOA) condition, a drain to source voltage threshold ($V_{DS}$), an RMS drain current threshold ($I_{DRMS}$), a forward and reverse bias safe operating area (SOA) pulse current threshold, ($I_{DM}$), a forward bias SOA drain current ($I_D$) boundary limited by drain to source on resistance ($R_{DS(on)}$), operating area of the controllable semiconductor) is monitored.

Device data information relating to the controllable semiconductor (e.g., at least one of: breakdown drain to source voltage $BV_{DSS}$, breakdown drain to source voltage $BV_{DSS\_p}$ protection threshold, rated drain to source voltage $V_{DSS}$, rated drain to source voltage $V_{DSS}$ protection threshold, maximum single pulse current $I_{DM}$, maximum single pulse current $I_{DM}$ protection threshold, continuous drain current $I_D$, continuous drain current $I_D$ protection threshold, avalanche current $I_{AR}$, avalanche current $I_{AR}$ protection threshold, default Forward Biased Safe Operating Area (FBSOA) for a single pulse at a predetermined junction temperature $T_J$, default Reverse Biased Safe Operating Area (RBSOA) for a for a single pulse at a predetermined junction temperature $T_J$, a junction-to-case transient thermal impedance curve for at least one of normal and avalanche modes, heat sink to case thermal impedance $Z_{thhc}$, junction to case thermal impedance $Z_{thjc}$, on state resistance at a predetermined temperature T ($R_{DS(on)(at\ temp\ T)}$, normalized on state resistance $R_{DS}(ON)$ versus temperature, heat sink temperature $T_{HS}$ as a function of dissipated power $T_{HS}(P_M)$, junction temperature $T_J$ threshold, reverse recovery charge of the integral body diode $Q_{rr}$ and reverse recovery time $t_{rr}$, of the integral body diode $Q_{rr}$.) is accessed.

Based on the device data information and the second operating parameter, a determination is made as to whether a first condition (e.g., at least one of over-temperature, current tunneling, excessive power, over-current, over-voltage, a coolant problem, a heat sink problem, a die defect, a die interconnect bonding defect, a die attachment defect, and a device package mounting defect) exists.

A first action is taken if the first condition exists. The first action can, for example, be at least one of:

(a) modifying operation of the controllable semiconductor;

(b) shutting down the controllable semiconductor;

(c) interrupting operation of the controllable semiconductor;

(d) switching an operation mode of the controllable semiconductor;

(e) determining a safe operating area (SOA) condition for the controllable semiconductor based on the detected first condition and adjusting the first parameter to maintain the SOA;

(f) checking a different second operating parameter;

(g) diagnosing the first condition;

(h) determining whether a second condition could occur based on the first condition, the second condition comprising at least one of over-temperature, current tunneling, excessive power, over-current, over-voltage, a coolant problem, a heat sink problem, a die defect, a die bonding defect, a die attachment defect, a device package mounting defect, a thermal interface problem for the power device, a reduced reliability of the power device, a failure of the power device under high current load, and a failure of the power device under high power load; and (i) providing a notification.

In a further embodiment the invention provides a method of determining operating conditions for a controllable semiconductor, the controllable semiconductor having a junction and a case, the method comprising:

accessing device data associated with the controllable semiconductor, the device data comprising a predetermined mean time between failure (MTBF);

computing a thermal impedance $Z_{thjc}$ between the junction and case of the controllable semiconductor measuring the junction temperature $T_j$ and the case temperature $T_c$ of the controllable semiconductor at least periodically;

calculating an allowable dissipated power based at least in part on $T_j$, $T_c$, and $Z_{thjc}$; and defining at least one dynamic, safe operating area (SOA) boundary for the controllable semiconductor based at least in part on the allowable dissipated power and the MTBF, the dynamic SOA being adjusted at least periodically based on the periodic measurements of $T_j$ and $T_c$.

In another embodiment, the invention provides, for a controllable semiconductor device capable of operating in switching and linear modes and comprising a die, a method for detecting current tunneling in the controllable semiconductor device, the method comprising the unordered steps of:

(a) monitoring a center die temperature at a location substantially near the center of the die;

(b) monitoring a periphery die temperature at a location substantially near the periphery of the die;

(c) shutting down the operation of the controllable semiconductor if the center die temperature of the die is greater than the periphery temperature and the operating mode of the controllable semiconductor is a switching mode; and (d) interrupting operation of the controllable semiconductor and changing its operating mode to a switching mode, if the center die temperature of the die is greater than the periphery temperature and the operating mode of the controllable semiconductor is a linear mode.

In a still further embodiment, the invention provides a method for determining actual and potential errors in the operation of a controllable semiconductor, the method comprising the unordered steps of:

(a) monitoring a set of parameters of the controllable semiconductors, the set of parameters comprising at least one of a device, operating, and temperature parameter;

(b) accessing a set of device data for the controllable semiconductor;

(c) determining, based at least in part on the set of parameters and the set of device data, predicted power dissipation and predicted junction temperature of the controllable semiconductor;

(d) measuring actual power dissipation and actual junction temperature of the controllable semiconductor;

(e) comparing the actual power dissipation to the predicted power dissipation;

(f) comparing the actual junction temperature to the predicted junction temperature;

(g) determining whether an actual error has occurred or a potential error may occur, in the controllable semiconductor, depending at least in part on the comparisons of (e) and (f); and (h) repeating steps (a) through (g) at least periodically during operation of the controllable semiconductor.

In yet another embodiment, the invention provides a method of determining the power handling capability of an installed device, comprising:

measuring a temperature of the installed device;

determining a predicted temperature change for the installed device expected as a result of a test pulse;

sending the test pulse to the installed device;

measuring actual temperature change of the installed device as a result of the test pulse; and comparing the actual temperature change to the predicted temperature change.

Details relating to these and other embodiments of the invention are described more fully herein.

BRIEF DESCRIPTION OF THE DRAWINGS

The advantages and aspects of the present invention will be more fully understood in conjunction with the following detailed description and accompanying drawings, in which.

The drawings are not to scale, emphasis instead being on illustrating the principles of the invention. In addition, in the drawings, like reference numbers indicate like elements.

DETAILED DESCRIPTION OF THE INVENTION

The description below explains certain features of the invention by providing examples using MOSFET devices, properties and characteristics. It should be understood, however, that the concepts and embodiments of the invention described herein apply to many other types of semiconductor devices, including but limited to controllable semiconductors, three terminal semiconductors, and such power semiconductors as Bipolar Junction Transistors (BJTs), Insulated Gate Bipolar Transistors (IGBTs), Gate Turnoff (GTO) thyristors, and Emitter Turnoff (ETO) thyristors.

In one aspect, the invention provides new features that add a level of functionality to conventional power semiconductors and defines and enables a new class of reconfigurable power systems. The new class of reconfigurable power systems includes a device that is referred to hereafter as an Integrated Smart Power Switch (ISPS). At least some implementations of the ISPS can help to resolve various problems of common power semiconductors, such as current tunneling, a static safe operating area (SOA), a lack of prognostic information, a lack of diagnostics, a lack of calibration, and inadequate inspection methods of installed devices.

At least some implementations of the invention also provide the following advantageous features:

(1) Detection and/or prevention of current tunneling by monitoring die temperature at multiple locations;

(2) Dynamic control of a safe operating area (SOA) in accordance with one or more of allowed die temperature for the device, device voltage and/or current, and required reliability for the device;

(3) Self-Diagnostics and prognostics to detect and provide advance warning of defects such as die, die bonding, die attachment, and device mounting defects, to help prevent catastrophic failures and increase reliability;

(4) Calibration and inspection of installed devices by pulse loading and monitoring the case temperature ($T_{case}$, also referred to herein as $T_c$) of the installed devices;

(5) Mapping of devices according to their case temperature rise and/or power handling capability; and (6) Advance warning of potential failures.

Figure 7:
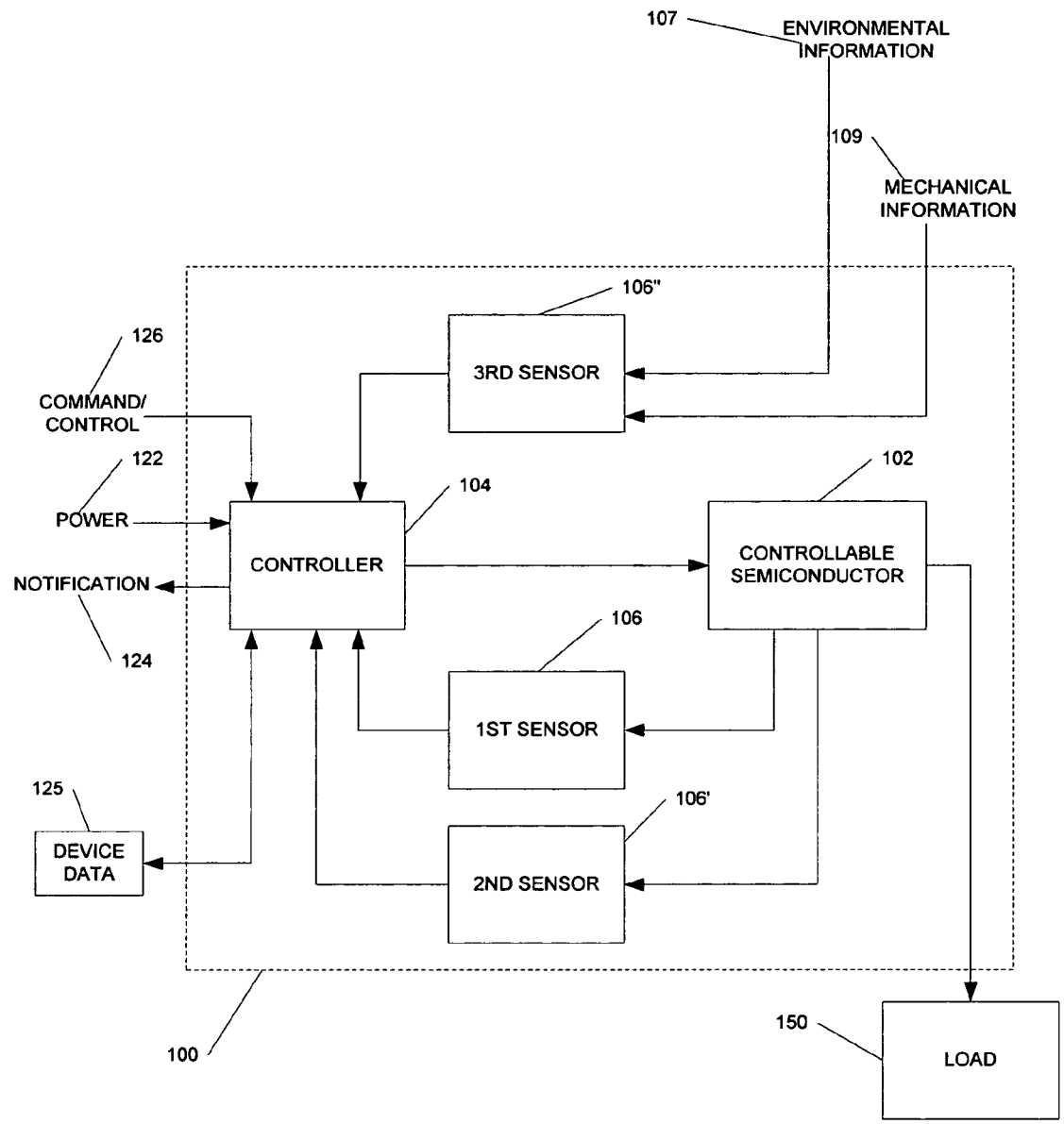
FIG. 7 is a first block diagram of an integrated smart power switch (ISPS), in accordance with one embodiment of the invention.
Figure 8:
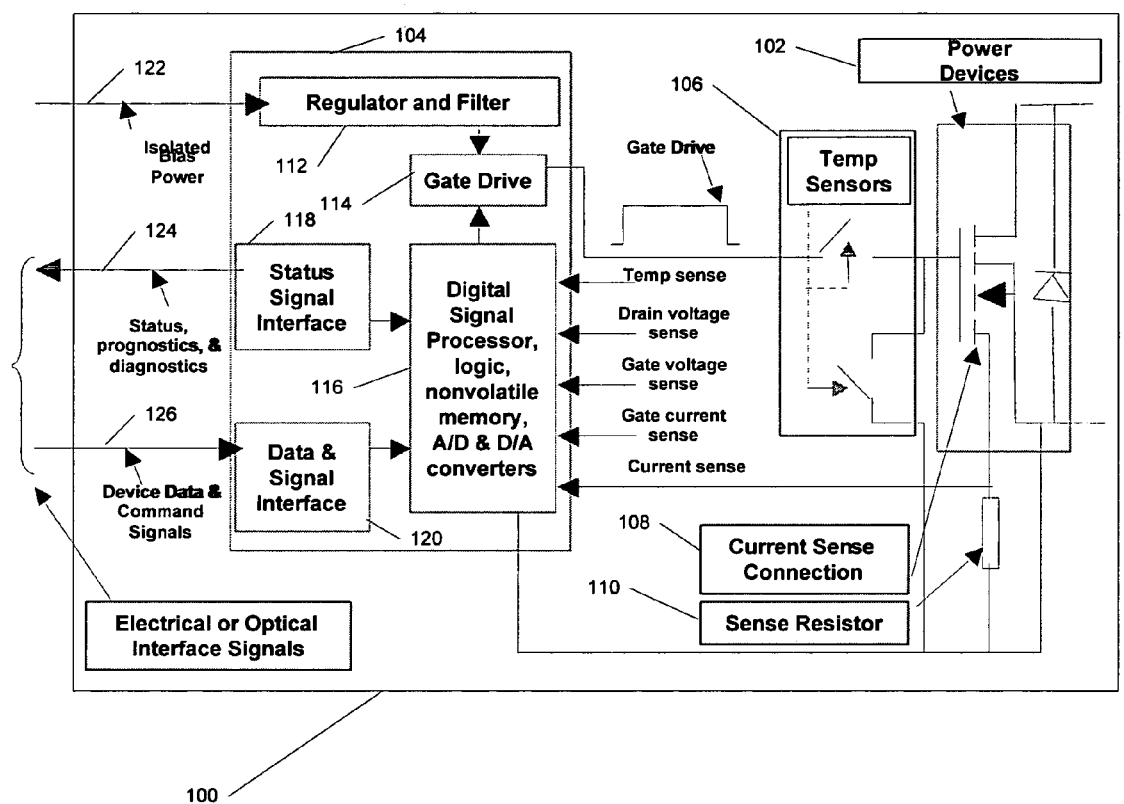
FIG. 8 is a second block diagram of an integrated smart power switch (ISPS) in accordance with one embodiment of the invention

FIG. 7 is a first block diagram of an integrated smart power switch (ISPS) 100, in accordance with one embodiment of the invention, and FIG. 8 is a second block diagram of an integrated smart power switch (ISPS), in accordance with one embodiment of the invention;

Referring to FIGS. 7 and 8, the ISPS 100 includes a controllable semiconductor device (also referred to herein as a controllable semiconductor 102 and shown, by way of illustration only in FIG. 8, as a MOSFET power device), at least one sensor 106, and a controller 104. As shown in FIG. 7, the ISPS 100 optionally can include additional sensors (shown as second sensor 106' and third sensor 106") and the ISPS 100 can provide power to an external load 150. Note that, in the block diagram of FIG. 7, for simplicity, connections are shown in a simplified form, with a single line indicating each connection. For example, the first sensor 106 may be monitoring the controllable semiconductor 102 at more than one location, and may provide more than one signal to the controller 104, but FIG. 7 still illustrates a single connection line.

During operation of the ISPS 100, the controller 104 controls operation of the controllable semiconductor 102 dependent upon inputs from the sensor 106 (e.g., as a feedback loop). For example, as shown in FIG. 8, the controller 104 controls the Gate Drive for the controllable semiconductor 102 and receives various sensed inputs from the sensor 106 (and, optionally, other sensors in the ISPS 100) to help the controller 104 determine (optionally in conjunction with additional information, such as device data 125) an appropriate gate drive. The controller 104 receives data from the sensor 106 at least periodically. Advantageously, the controller 104 receives data from the sensor 106 substantially continuously, so that the controller can rapidly and dynamically modify operation of the controllable semiconductor 102 via the control signal it provides to the controllable semiconductor 102.

In FIG. 8, the controllable semiconductor 102 is illustrated as a metal oxide field effect transistor (MOSFET), but that particular type of semiconductor is not limiting. An illustrative example of a MOSFET usable for at least some embodiments of the invention is a 1000 V, 37 A, 0.21 ohms MOSFET having part number APT10021JFLL, available from Advanced Power Technology, Inc. of Bend, Oreg. The controllable semiconductor 102 can be any type of a controllable semiconductor device, including but not limited to most types of three terminal semiconductors, power semiconductors, field effect transistors (FETS) including junction FETS (JFETS) and MOSFETS, Bipolar Junction Transistors (BJTs), Insulated Gate Bipolar Transistors (IGBTs), Static Induction Transistors (SITs), MOS-Controlled Thyristors (MCTs), Gate Turnoff (GTO) thyristors, and Emitter Turnoff (ETO) thyristors.

In the example where the controllable semiconductor 102 is a MOSFET, as shown in FIG. 8, the controllable semiconductor 102 is associated with various operating parameters, some of the parameters relating to parameters that can be externally controlled, some of the parameters being measurable (e.g., by a sensor), and some of the parameters being associated with the controllable semiconductor 102 itself. For example, operating parameters of the controllable semiconductor 102 that can be measured include (but are not limited to) drain voltage, gate voltage, gate current, average drain device current, peak drain current, RMS drain current, die temperature, case temperature, junction temperature ($T_j$), switching frequency, and duty cycle.

Operating parameters of the controllable semiconductor 102 that can be controlled (e.g., by the controller 104 or other external control) include (but are not limited to): gate drive, transistor bias, a safe operating area (SOA) condition, a drain to source voltage threshold ($V_{DS}$), an RMS drain current threshold ($I_{DRMS}$), a forward and reverse bias safe operating area (SOA) pulse current threshold, ($I_{DM}$), a forward bias SOA drain current ($I_D$) boundary limited by drain to source on resistance ($R_{DS(on)}$), operating area of the power device.

Operating parameters of the controllable semiconductor 102 associated with the device itself include (but are not limited to) device data 125 such as: breakdown drain to source voltage $BV_{DSS}$, breakdown drain to source voltage $BV_{DSS\_p}$ protection threshold, rated drain to source voltage $V_{DSS}$, rated drain to source voltage $V_{DSS}$ protection threshold, maximum single pulse current $I_{DM}$, maximum single pulse current $I_{DM}$ protection threshold, continuous drain current $I_D$, continuous drain current $I_D$ protection threshold, avalanche current $I_{AR}$, avalanche current $I_{AR}$ protection threshold, default Forward Biased Safe Operating Area (FBSOA) for a single pulse at a predetermined junction temperature $T_j$, default Reverse Biased Safe Operating Area (RBSOA) for a for a single pulse at a predetermined junction temperature $T_j$, a junction-to-case transient thermal impedance curve for at least one of normal and avalanche modes, heat sink to case thermal impedance $Z_{thhc}$, junction to case thermal impedance $Z_{thjc}$, on state resistance at a predetermined temperature T ($R_{DS(on)(at\ temp\ T)}$, normalized on state resistance $R_{DS}(ON)$ versus temperature, heat sink temperature $T_{HS}$ as a function of dissipated power $T_{HS}(P_M)$, junction temperature $T_j$ threshold, reverse recovery charge of the integral body diode $Q_{rr}$ and reverse recovery time $t_{rr}$, of the integral body diode $Q_{rr}$.

The device data 125 described above can, for example, be provided as part of a manufacturer's data sheet and can be provided to the controller 104. In one embodiment, the controller 104 accesses device data 125 as needed, where the device data is located external to the ISPS 100. In another embodiment, the controller 104 receives and stores device data in its built-in memory (e.g., the nonvolatile memory of FIG. 8).

Operating parameters can also include environmental and/or mechanical parameters (also referred to, in FIG. 7, as environmental information 107 and mechanical information 109) that may affect operation of the controllable semiconductor 102. Environmental parameters include, but are not limited to, temperature, coolant flow, a moisture level, and current drawn by an external load. Mechanical parameters include, but are not limited to, stress, strain, force, movement, vibration, acceleration, and shock. As those skilled in the art appreciate, environmental parameters, especially temperature and moisture level, can have a significant effect on the performance of a semiconductor device. Similarly, mechanical parameters can affect semiconductor device performance, especially if the mechanical parameter causes physical damage to all or part of the semiconductor device.

The sensor 106 can be any device known in the art that is adapted for sensing one or more the operating parameters described above. Advantageously, at least some embodiments of the invention use a plurality of sensors (e.g., the first, second, and third sensors 106, 106', and 106", as shown in FIG. 7). The sensor 106 can, for example, be a voltage sensor, a current sensor, a temperature sensor, a mechanical sensor, etc. As illustrated in FIG. 8, the sensor 106 can be a temperature sensor. The ISPS 100 of FIG. 8 also includes a second sensor in the form of a current sense 108, including a sense resistor 110. Together, the sensor 106, current sense 108, and sense resistor 110 provide operating parameter data to the controller 104. This operating parameter data is illustrated, by way of example, in FIG. 8 as the inputs to the controller 104 labeled as "Temp Sense", "Drain Voltage Sense," "Gate Voltage Sense", "Gate Current Sense", and "Current Sense".

In at least one embodiment, the sensor 106 is configured to sense the same parameter at more than one location on the ISPS 100, as an aid to detecting certain types of errors and problems. For example, in one embodiment, the sensor 106 is configured to sense temperature at more than one location on the controllable semiconductor 102 (e.g., temperature at center of a die of the controllable semiconductor 102, temperature at one or more spots on periphery of the die, etc.). When the controllable semiconductor 102 develops a problem such as current tunneling, the temperature in the center of the die exceeds temperature at its periphery. Thus, the detection of temperature difference between the center of the die and its periphery indicates the onset of current tunneling.

As those skilled in the art will appreciate, there are multiple ways to implement the sensor 106. For example, the sensor 106 can be implemented as a plurality of discrete sensors, as a single sensor with multiple inputs for various respective points, and many other configurations, depending on the particular application. The sensor 106 can also be part of the controllable semiconductor 102 and/or the controller 104.

The controller 104 is a programmable device capable of: (a) receiving inputs from one or more sensors 106; (b) receiving bias power 122 (as an input to drive the controllable semiconductor 102), (c) receiving command/control signals 126; (d) accessing and/or storing device data 125 associated with the controllable semiconductor 102; (e) processing one or more of the (a) through (d) this information to control operation of the semiconductor device; and (e) providing status/notification signals 124.

As shown in FIG. 8, in one embodiment, the controller 104 includes an on-board regulator and filter 112, an input receiving bias power 122 (such as isolated bias power), input and output signals interface including an first interface 118 for providing status, prognostic, and diagnostic information 124 and a second interface 120 for receiving device data and command signals 126, a gate drive circuit 114 (such as the UCD7100 available from Texas Instruments of Dallas, Tex.), a digital signal processor (DSP) or microcontroller 116 optionally having nonvolatile memory (e.g., to store device data), and analog/digital (A/D) and digital/analog (D/A) converters.

The controller 104 advantageously is programmable to implement one or more of the methods of FIGS. 9, 10, 13, 14 and 15, which are described below. These methods implement at least some new features of the invention, including but not limited to current tunneling protection, dynamic Safe Operating Area, diagnostics and prognostics, and calibration of installed devices. As those skilled in the art will appreciate, the methods of FIGS. 9, 10, 11, 14 and 15 are applicable to, and can be adapted for, virtually any type of power device, although by way of example the methods are particularly illustrated using the controllable semiconductor 102, implemented as a MOSFET.

For example, in one embodiment, a method for controlling a power device, such as the ISPS 100 of FIGS. 7 and 8, uses continuous monitoring of the die temperature of the controllable semiconductor 102 at more than one location to detect hot spotting and prevent damage to the controllable semiconductor 102. When the controllable semiconductor 102 develops current tunneling, the temperature in the center of the die exceeds temperature at its periphery. Thus, the detection of temperature difference between the center of the die and its periphery indicates the onset of current tunneling.

If a sensor 106, such as a temperature sensor, detects hot spotting when the controllable semiconductor 102 operates in the switching mode, the controllable semiconductor 102 is commanded to shut down. Alternately, if the controllable semiconductor 102 operates in a linear mode, as an alternative to shutdown, the controller 104 can interrupt operation of the controllable semiconductor 102, change the mode of the controllable semiconductor 102 to switching, and resume operation supplying or sinking equivalent average current. One implementation of a current tunneling protection method is illustrated in FIG. 9, which is a flowchart of a control method 200 for controlling a power device, such as an ISPS 100, in accordance with one embodiment of the invention.

Figure 9:
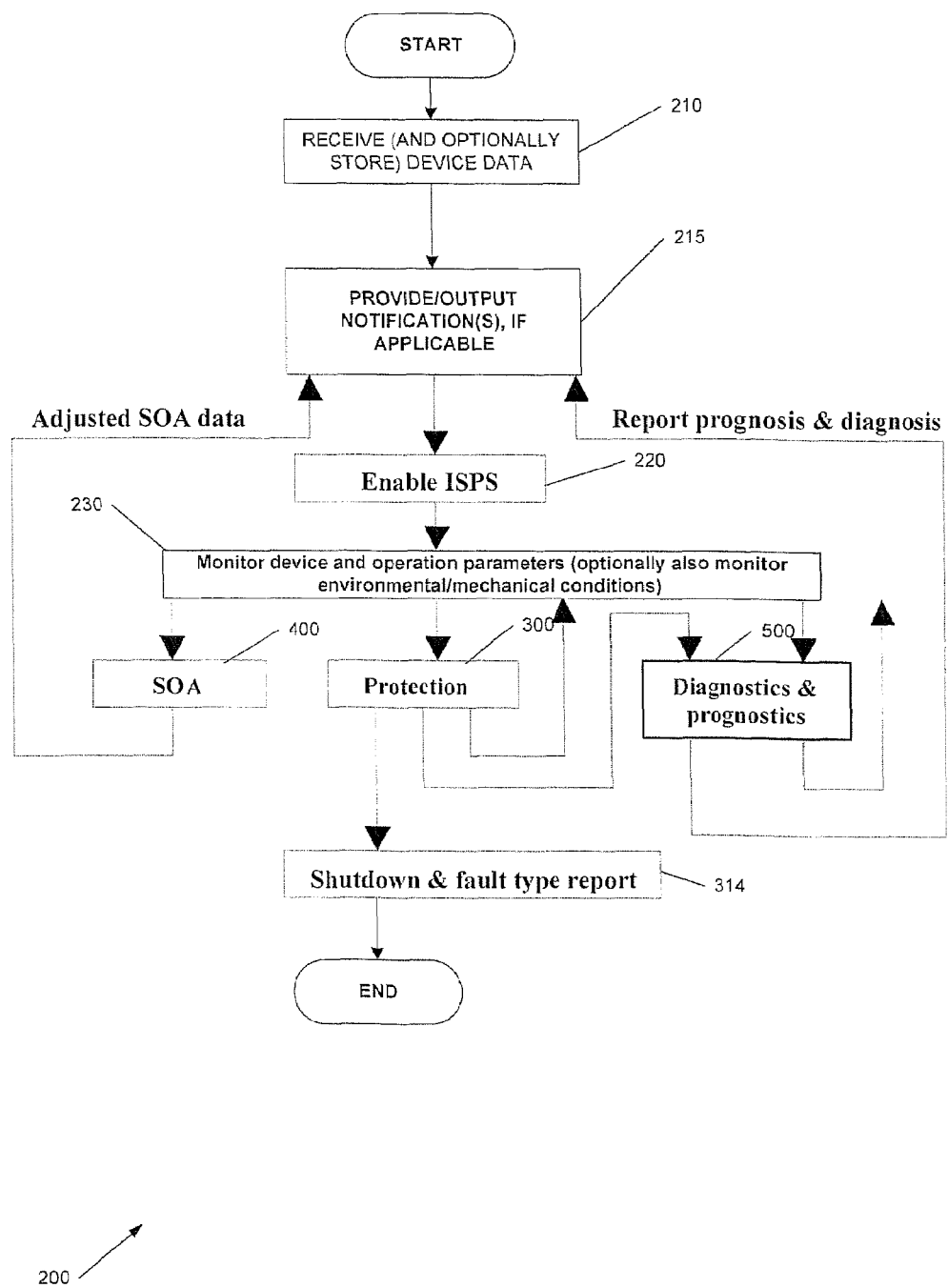
FIG. 9 is a flowchart of a method for controlling a power device, in accordance with one embodiment of the invention.

Referring to FIGS. 7, 8 and 9, in a control method 200, device data 125, is received at the controller 104 (block 210). The controller 104 can receive device data 125 in many different ways. For example, the device data 125 can be manually inputted to the controller 104 by a user or other entity; the controller can access device data stored elsewhere (such as on a remote device); the controller 104 can be initialized upon its power-up to be loaded with device data 125, etc. The controller 104 can receive device data far in advance of the other blocks in this method. Also, in block 210, the device data 125 optionally can be stored in the ISPS 100, such as in the controller 104's memory, if the controller 104 has on-board memory. The controller 104 alternately can access externally stored device data 125, or can request device data 125, whenever the controller 104 needs it.

Figure 1:
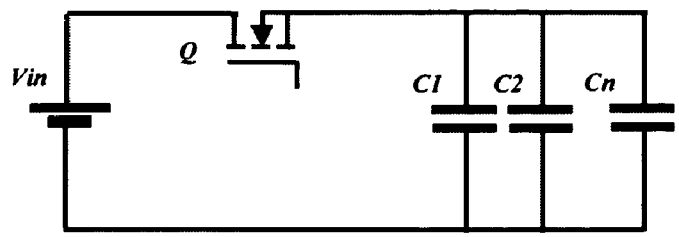
FIG. 1 is a schematic of a transistor circuit operating in linear mode.
Figure 2:
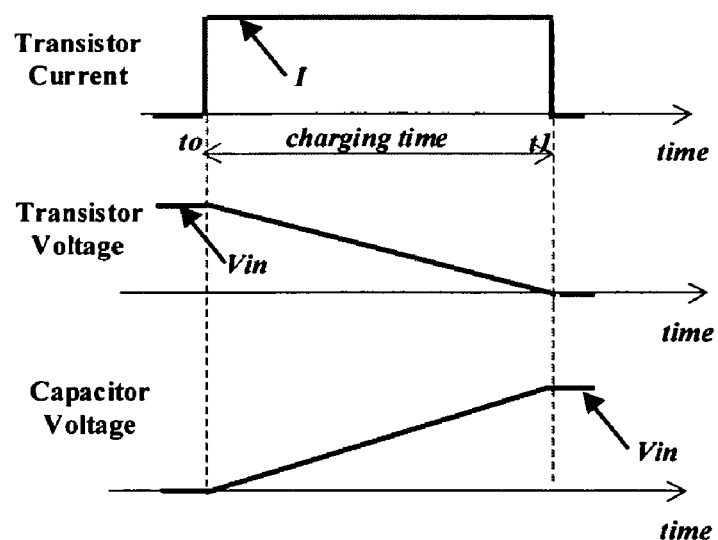
FIG. 2 is a graph showing parameters for the transistor circuit of FIG. 1.
Figure 3:
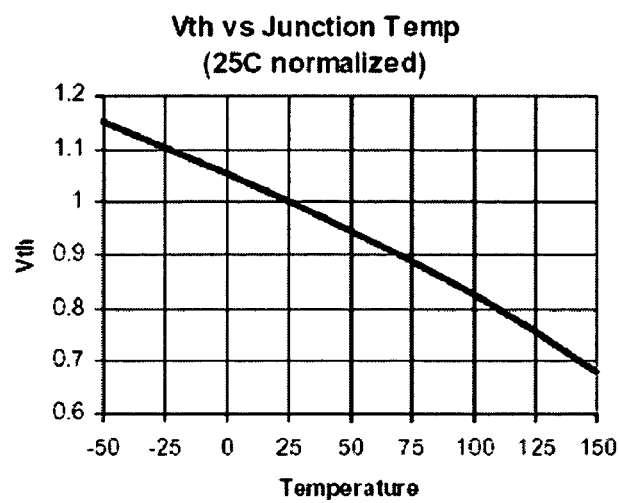
FIG. 3 is a graph of transistor gate threshold voltage as a function of temperature, for the transistor of FIG. 1.
Figure 4:
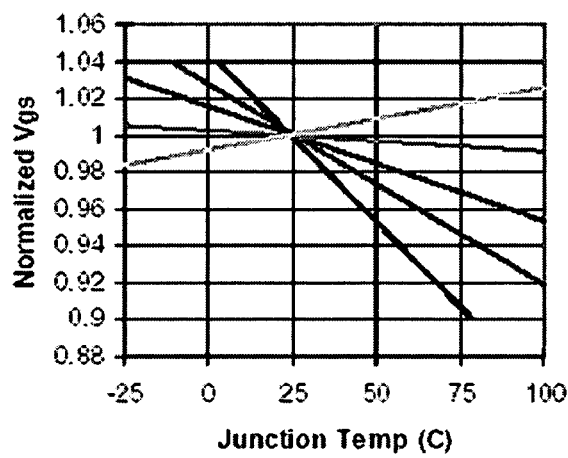
FIG. 4 is a graph of transistor gate to source threshold voltage versus junction temperature curves for various drain currents, for the transistor of FIG. 1.
Figure 5:
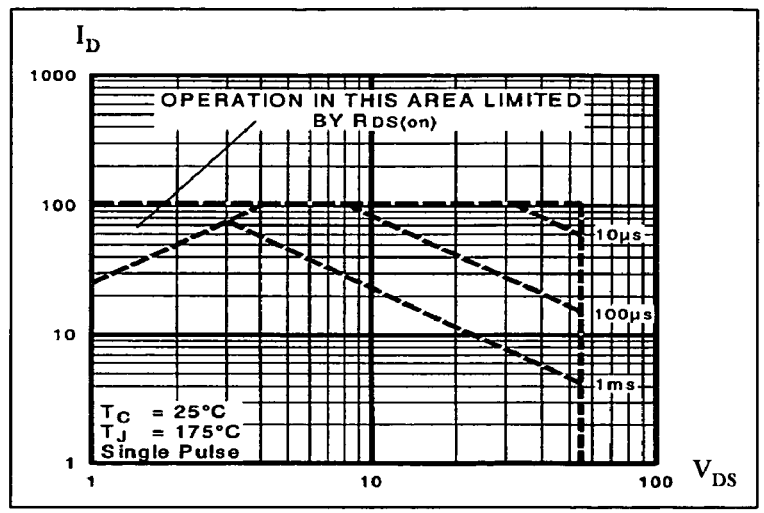
FIG. 5 is an illustrative graph of forward biased safe operating area (FBSOA) curves.
Figure 6:
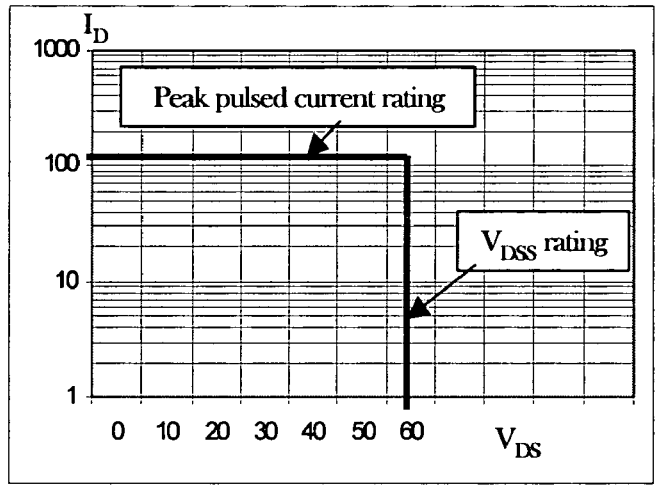
FIG. 6 is an illustrative graph of reverse biased safe operating area (RBSOA) curves.

If applicable, a status or notification message may be generated (block 215) and provided to an external user. The status message, for example, could include information about the device data 125. As the control method 200 of FIG. 9 progresses, the status message of block 215 can include a notification about the safe operating area (SOA) for the ISPS 100 and/or a notification about an actual or potential defect in the ISPS 100 that has been detected The ISPS 100 is enabled (block 220). As an example, for the ISPS of FIG. 1, this is accomplished by the controller 104 providing the power device with a signal sufficient to enable the controllable semiconductor 102. For example, if the controllable semiconductor 102, is a MOSFET, the ISPS would be enabled by the controller 104 providing a gate drive signal sufficient to drive the MOSFET into either a linear or switching mode (whichever is applicable for the given application).

Operation of the ISPS 100 is monitored (block 230). This monitoring occurs at least periodically, and, advantageously, it occurs substantially continuously. Monitoring operation includes monitoring one or more of the following device and/or operational parameters: die temperature, case temperature, drain voltage, gate voltage, peak drain current, root-mean-square (RMS) drain current, average drain current, gate current, junction temperature ($T_J$), switching frequency, and duty cycle.

Additional operational parameters can be monitored in block 230. For example, other operational parameters that can be monitored include (but are not limited to) environmental parameters or conditions, such as environmental information 107 (e.g., a temperature, a flow of coolant, a moisture level, and/or current drawn by an external load) and mechanical parameters or conditions, such as mechanical information 109 (e.g., stress, strain, force, movement, vibration, acceleration, and/or shock).

After block 230, the control method 200's processes are split into three methods, each of which may be executed (but is not required to be executed) substantially simultaneously. Block 400 represents the safe operating area (SOA) method 400, which is explained further herein in connection with FIG. 13. Block 300 represents the protection method 300, which is explained further herein in connection with FIG. 10. Block 500 presents the diagnostics and prognostics method 500 which is explained further herein in connection with FIG. 14.

Note that one output of the protection method 300 (block 300) is a shutdown and fault type report (block 314), which (if the ISPS 100 is shut down) ends operation of the ISPS 100 (and thus ends the control method 200).

Figure 10:
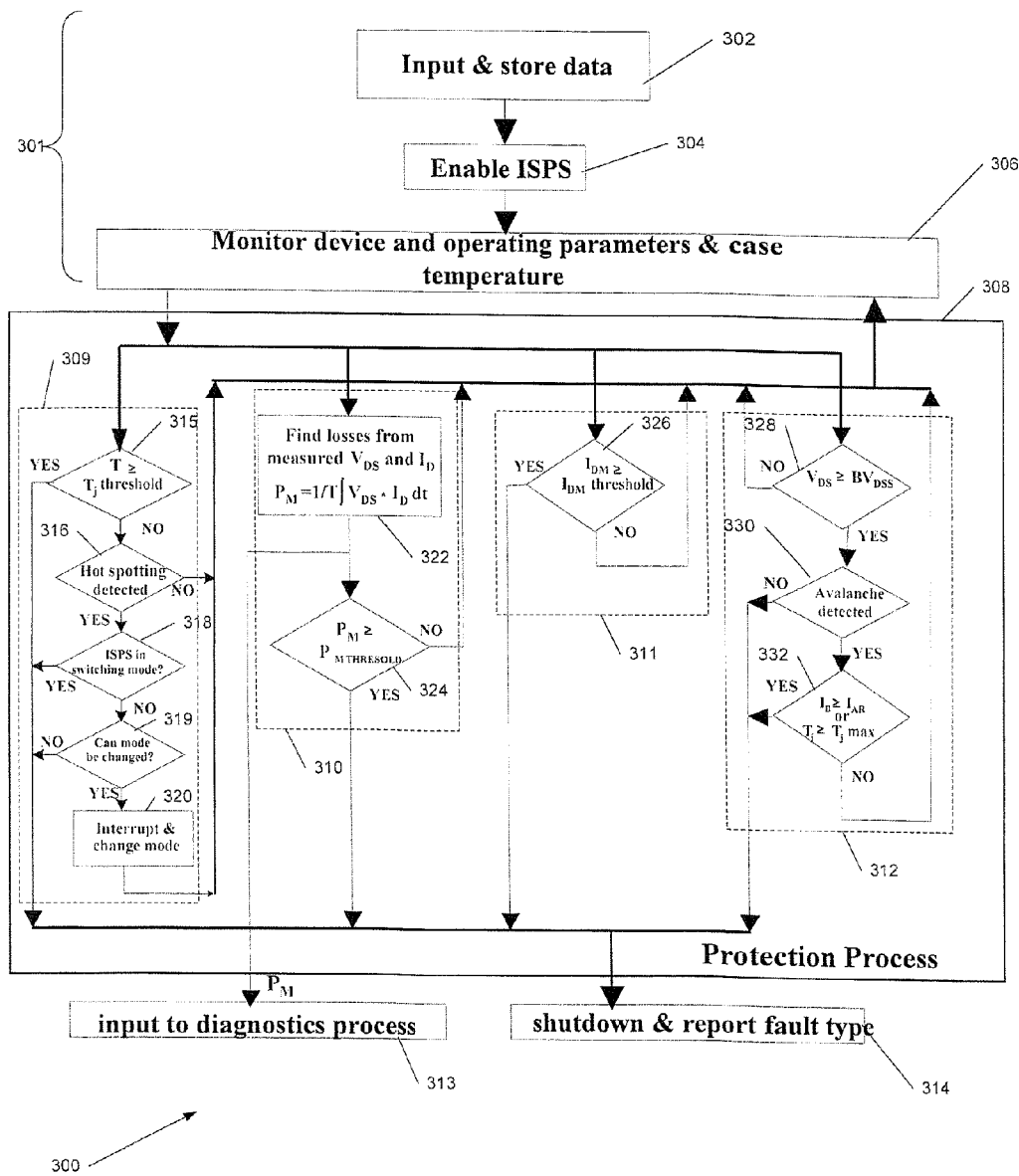
FIG. 10 is a flowchart of a method for protection of a power device, in accordance with one embodiment of the invention.

FIG. 10 is a flowchart of a protection method 300 for protection of a power device, such as the ISPS 100, in accordance with one embodiment of the invention. The protection method 300 can be adapted for the protection of virtually any type of power device, as those of skill in the art will appreciate. The protection method 300 can be implemented as part of the control method 200 of FIG. 9, or can be implemented as a stand-alone method. If the protection method 300 of FIG. 10 is implemented as part of the control method 200 of FIG. 9, then the blocks that are part of block 301 (which includes blocks 302, 304, 306) are accomplished via blocks 210-230 of FIG. 9, and the protection method 300 begins after block 306 in FIG. 10.

Else, if the protection method 300 is implemented as a stand-alone method, blocks 302, 304, and 306 are executed. The "Input and Store Data" functions performed in block 302 of FIG. 10 are substantially the same as the "Receive (and Optionally Store) Device Data" functions of block 210 of FIG. 9, and the description provided above for block 210 is applicable to block 302. The "enable ISPS" functions of block 304 of FIG. 10 are substantially the same as the "Enable ISPS" functions of block 220 of FIG. 9, and the description provided above for block 220 is applicable to block 304. Likewise, the "Monitor device and operating parameters and case temperature" functions of block 306 of FIG. 10 are substantially the same as the "Monitor Device and Operation Parameters" functions of block 230 of FIG. 9, and the description provided above for block 230 is applicable to block 306.

Referring again to FIG. 10 and also FIGS. 7 and 8, after the device and operating parameters are monitored, the protection method 300 splits its protection tasks into four sub groups (where the sub groups may operate concurrently, but are not required to do so): over-temperature and current tunneling protection 309, excessive power protection 310, over-current protection 311, and over-voltage protection 312.

In the over temperature and current tunneling protection 309 sub group, (blocks 315-320), the controller 104 checks (block 315) whether the junction temperature ($T_J$) in the controllable semiconductor 102 is greater than or equal to the $T_J$ threshold (as determined by the device data of block 302). If $T_J$ is greater than or equal to the $T_J$ threshold, then the controller 104 shuts down the controllable semiconductor 102 and provides a notification that reports the failure type (block 314).

If $T_J$ is not greater than or equal to the $T_J$ threshold, then the controller 104 checks whether hot spotting (also referred to as current tunneling) has been detected in the controllable semiconductor 102. This can be done in several different ways, as those of skill in the art will appreciate. For example, the controller 104 can check for (a) variations in the current density and temperature across the device; (b) whether some locations of the die of the controllable semiconductor 102, especially near the center of the die, start running with a lower transistor gate threshold voltage $V_{th}$; and/or (c) a localized increase in current density (caused by higher forward transconductance) in any part of the controllable semiconductor 102. The preferred method is to monitor temperature variations across the die.

If hot spotting/current tunneling has not been detected, then the protection method 300 jumps back to block 306. If, however, block 316 shows that hot spotting/current tunneling has been detected and the ISPS 100 is in switching mode (block 318), the controller shuts down the controllable semiconductor 102 and reports failure type (block 314). If block 316 shows that hot spotting/current tunneling has been detected, a check is made to see if the operating mode can be changed (block 319). For example, if the ISPS 100 is in linear mode, (block 318), operation of the controllable semiconductor 102 can be interrupted (block 320) without turning the ISPS 100 off (e.g. by biasing the controllable semiconductor 102 off via changing the gate drive signal). If load characteristics allow operation with pulsed current, the controller 104 then changes the mode of the controllable semiconductor 102 to a switching mode (block 320), resumes operation of the ISPS 100 feeding or sinking equivalent average current or power (depending on the application), and jumps back to block 306. If, at block 319, the mode cannot be changed (e.g., because the load characteristics are not compatible with pulsed current), the controllable semiconductor 102 is shut down and the failure type is reported (block 314).

In the excessive power protection sub group 310, the controller 104 finds total transistor losses $P_M$ (block 322) from two measured operating parameters: drain to source voltage ($V_{DS}$) and drain current $I_D$. This can be done in several ways, such as by integrating the product of its instantaneous voltage and current over the time interval T. If the controllable semiconductor 102 is switching with fixed frequency, the time interval T is the period of the switching frequency. If the controllable semiconductor 102 operates in the linear mode or switching mode with variable frequency, the power dissipation of the controllable semiconductor is found by averaging losses over a time interval that preferably includes a number of turn on and turn off events. When the losses are computed (block 322), the information is provided (block 313) to the diagnostics and prognostics method 500, which is discussed further in connection with FIG. 14. If the total loss $P_M$ exceeds or is equal to the loss $P_M$ threshold (block 324), then the controller 104 shuts down the ISPS 100 and provides a notification as to the failure/fault type (block 314). If, however, the total loss $P_M$ is less than the loss threshold, then the method jumps back to block 306.

Referring again to FIG. 10, in the over current protection sub group 311, the controller 104 checks whether the pulse current $I_{DM}$ exceeds or is equal to the threshold (block 326). If it does, the controller 104 shuts down the ISPS 100 and reports the failure/fault type (block 214). If the pulse current $I_{DM}$ does not exceed the threshold, then the method jumps back to block 306.

For overvoltage protection, it should be noted that, for at least some embodiments of the invention, it may be feasible to provide over-voltage protection only when the ISPS 100 has an additional means of removing its prime power to the ISPS 100 or if the ISPS 100 has an external circuit containing transient voltage suppressors such as semiconductors, Metal Oxide Varistors (MOVs), spark gaps, or any other appropriate devices.

In the over-voltage protection sub group 312, the controller 104 checks the controllable semiconductor 102 drain to source over-voltage $V_{DS}$ (block 328) to see if it is less than the controllable semiconductor 102's breakdown voltage $V_{DSS}$. For example, one way the controller 104 can do this is by measuring leakage current (e.g., via current sensor 108). If the transistor voltage $V_{DS}$ is less than its breakdown voltage, $V_{DSS}$, the method goes back to block 306. If $V_{DS}$ is greater or equal than its breakdown voltage, the controller checks for an avalanche condition (block 330). One way to check for this is to check whether drain to source voltage $V_{DS}$ is constant while drain current flows through the controllable semiconductor. If $V_{DS}$ is not constant (and if the conditions of block 328 are satisfied) there is no avalanche condition in the controllable semiconductor 102, and the most likely outcome is failure of the controllable semiconductor 102. So, if no avalanche condition is detected in block 330, the controller 104 shuts down the ISPS 100 and reports the failure/fault type (block 214).

If, however, the controller 104 determines that the $V_{DS}$ is staying constant, substantially decaying drain current flows through the controllable semiconductor, and the conditions of block 328 are met, then the controllable semiconductor 102 is in an avalanche condition. The controller 104 then checks (block 312) whether the drain current $I_D$ is greater than or equal to the avalanche current $I_{AR}$ or whether the junction temperature $T_J$ is greater than or equal to the maximum junction temperature. $T_{J\,max}$ (block 332). If either of these conditions is met, then the controllable semiconductor 102 has failed or is approaching failure, and the controller 104 shuts down the ISPS 100 and reports the failure/fault type (block 314). If neither of the conditions in block 332 is met, then the method jumps back to block 306.

Another aspect of the invention provides a method for dynamic control of the Safe Operating Area (SOA) of the controllable semiconductor 102 (FIGS. 7, 8). This method permits full use of the controllable semiconductor 102's die (e.g., a transistor die) and also allows safely increasing current in accordance with the controllable semiconductor 102's required reliability and junction temperature.

Figure 11:
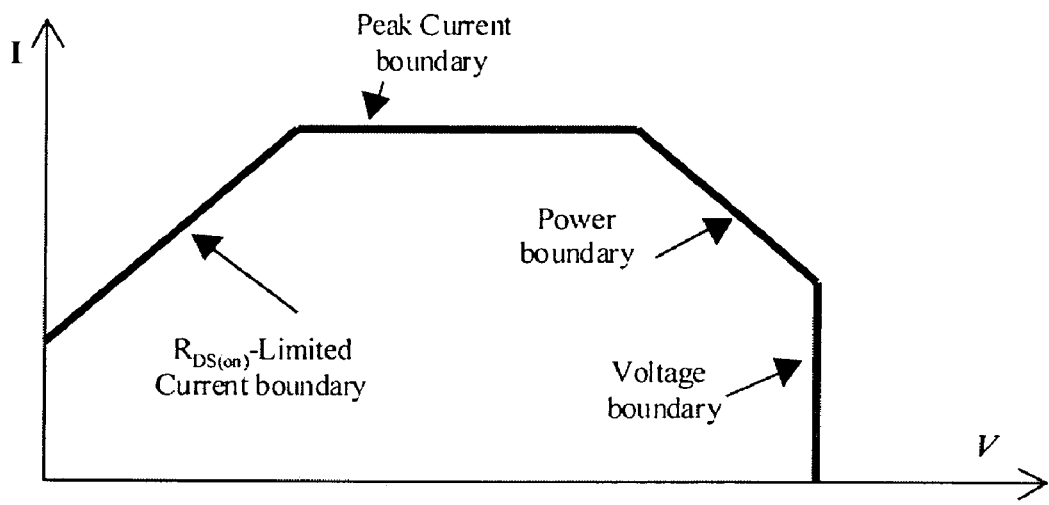
FIG. 11 is a graph illustrating boundaries of a forward biased safe operating area, in accordance with one embodiment of the invention.

FIG. 11 is a graph illustrating boundaries of a forward biased safe operating area (FBSOA), for an illustrative controllable semiconductor 102 (in this example, a MOSFET). These boundaries are provided (or can be computed) based on the device data provided for the controllable semiconductor 102 (e.g., in a device data sheet) For example, because the drain to source resistance $R_{DS}$ of a MOSFET is known, the $R_{DS(on)}$-limited current boundary shown in FIG. 11 can be determined by applying increasing amounts of voltage across the drain to source and measuring how much current is flowing. There is a limit to how much current can flow regardless of increased voltage (i.e., the peak current boundary), and, further along the FBSOA boundary of FIG. 11, it can be seen that the controllable semiconductor 102 is also subject to a power boundary, eventually reaching a limit, shown by the voltage boundary of FIG. 11, beyond which the controllable semiconductor 102 will not operate with the required/desired MTBF.

Figure 12:
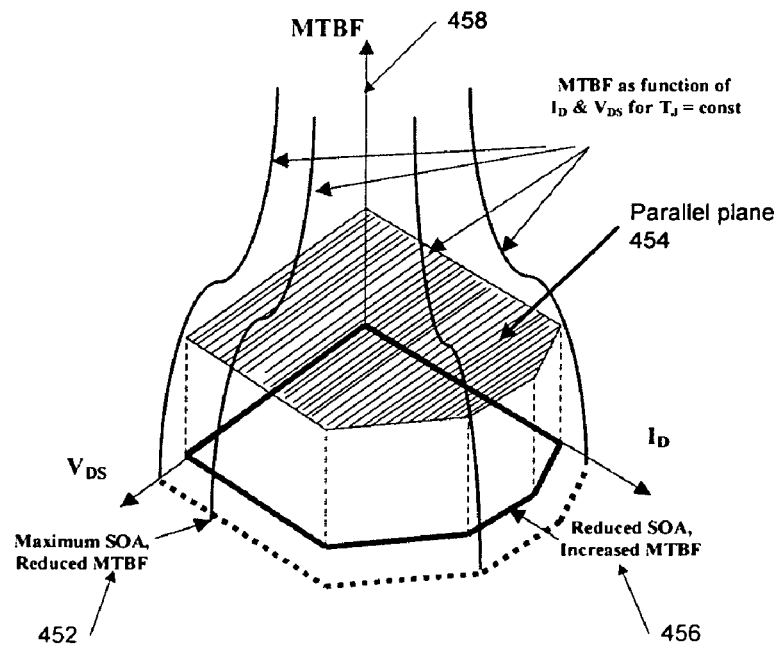
FIG. 12 is a graph illustrating a concept of a dynamic safe operating area, in accordance with one embodiment of the invention.

FIG. 12 is a graph illustrating a concept of a dynamic safe operating area, in accordance with one embodiment of the invention. Curves representing the function of MTBF of voltage and current for fixed junction temperature to form a three-dimensional surface (a cross section of this surface is shown in FIG. 12 as the shaded area labeled "Parallel Plane 454"). For clarity, the $R_{DS(on)}$-limited current boundary of FIG. 11 is not shown in FIG. 12. An area on the plane bounded by dotted lines in FIG. 12 represents the Maximum Safe Operating Area 452 (MSOA) that corresponds to minimum (also referred to as "reduced") MTBF. An area on the parallel plane 454 represents an Increased MTBF and reduced SOA 456. To realize the concept of a Dynamic Safe Operating Area (DSOA), the method of FIG. 13 effectively "slides" the SOA up and down the MTBF axis 458 to achieve the desired performance.

The method of FIG. 13 (described further below) enables real time control of SOA by adjusting transistor voltage and current in accordance with junction and case temperature and load characteristics. Operation of the method of FIG. 13 helps to ensure: (a) self-protection of an ISPS 100 under substantially all operating conditions (that is, the ISPS 100, via its controller 104 and the measurements made via sensors 108, can self-correct and self-adjust to maintain a safe operating area; (b) optimization of die size and reduced cost; and (c) safe increase of pulsed current in the battle short state (e.g., the SOA of the ISPS 100 can be increased to the level allowed by the maximum SOA 452) in the event of a crisis or emergency, to prevent the ISPS 100 from shutting itself down at a critical time—the ISPS 100 can be put in such a battle short state, for example, via command/control 128).

For example, if it is expected that there will an occasional increase in power dissipation (e.g., during start-up or operation with higher switching frequency when switching losses go up), and it is expected that the ISPS 100 can only work with the derated or "mid-level" SOA 456, one solution is to use a larger die that can handle higher power at the specified derating level. Using the method of FIG. 13, it is possible to slide the parallel plane down towards higher power for the duration of the transient condition thereby achieving the goal with a smaller, less expensive die.

Figure 13:
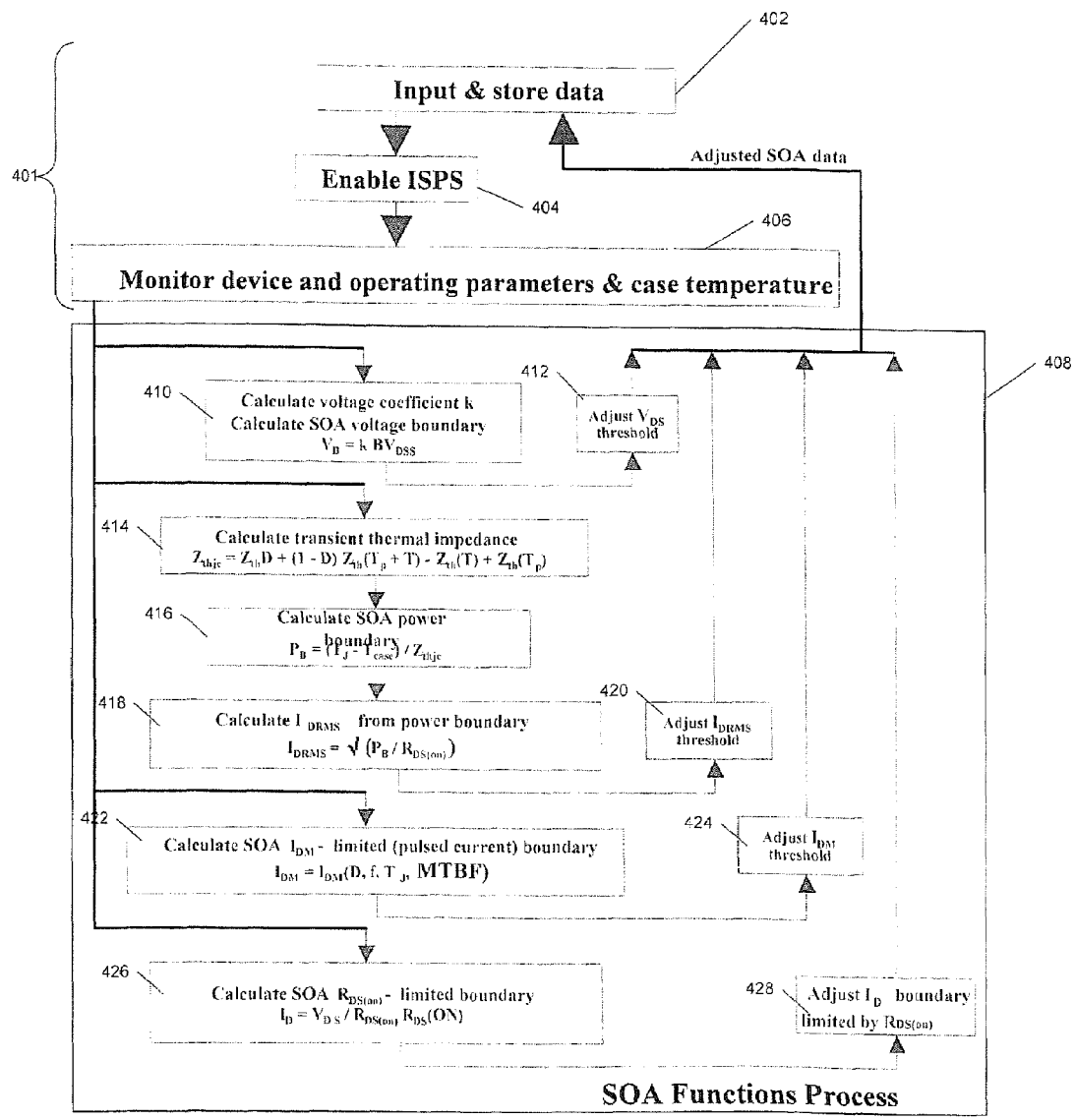
FIG. 13 is a flowchart of a method for dynamic control of safe operating area (SOA) for a power device, in accordance with one embodiment of the invention.

FIG. 13 is a flowchart of a method 400 ("SOA method") for dynamic control of safe operating area (SOA) for a power device, such as the ISPS 100, in accordance with one embodiment of the invention. The SOA method 400 can be adapted for dynamically adjusting the operating parameters of virtually any type of power device, as those of skill in the art will appreciate. In addition, the SOA method 400 of FIG. 13 can be implemented as part of the control method 200 of FIG. 9, or can be implemented as a stand-alone method. If the SOA method 400 of FIG. 13 is implemented as part of the control method 200, then the blocks that are part of block 401 (which includes blocks 402, 404, 406) are actually accomplished via blocks 210-230 of FIG. 9, and the SOA method 400 begins after block 406 in FIG. 13, shown as the SOA Functions Process 408.

Else, if the protection method 400 is implemented as a stand-alone method, blocks 402, 404, and 406 are executed. The "Input and Store Data" functions performed in block 402 of FIG. 13 are substantially the same as the "Receive (and Optionally Store) Device Data" functions of block 210 of FIG. 9, and the description provided above for block 210 is applicable to block 402. The "enable ISPS" functions of block 404 of FIG. 13 are substantially the same as the "Enable ISPS" functions of block 220 of FIG. 9, and the description provided above for block 220 is applicable to block 404. Likewise, the "Monitor device and operating parameters and case temperature" functions of block 406 of FIG. 13 are substantially the same as the "Monitor Device and Operation Parameters" functions of block 230 of FIG. 9, and the description provided above for block 230 is applicable to block 406.

Referring to FIGS. 7, 8, and 11, the controller 104 calculates voltage coefficient k as a function of $T_J$, $I_D$, MTBF, and other applicable factors (block 410). This result is used to help calculate the forward biased safe operating areas (FBSOA) and reverse biased safe operating area (RBSOA) voltage boundary $V_B$ (block 402), as shown in Equation (1) below.

$$V_B = kV_{DSS} \qquad \text{Eq. (1)}$$

The voltage coefficient k and the voltage boundary $V_B$ are provided to block 402 to adjust the default boundary derived from the single pulse, 25° C. SOA curves, which are part of the device data accessed in block 402.

In block 414, the controller 104 calculates junction to case transient thermal impedance $Z_{thjc}(t)$ using pulse width $T_p$, frequency, and duty cycle D, as shown in Equation (2) below:

$$Z_{thjc} = Z_{th}D + (1-D)Z_{th}(T_p+T) - Z_{th}(T) + Z_{th}(T_p) \qquad \text{Eq. (2)}$$

In block 416, the controller 104 calculates the FBSOA power boundary $P_B$ using $Z_{thjc}$, as shown in Equation (3) below $$P_B = (T_j - T_{case})/Z_{thjc} \qquad \text{Eq. (3)}$$

In block 418, the controller 104 calculates RMS drain to source current $I_{DRMS}$ from the power boundary $P_B$ (see equation (4) below) and this information is used (block 420) to adjust the default RMS current threshold, back at step 402. That is, the default RMS current threshold is adjusted and fed back to the device data accessed at block 402, to dynamically adjust this aspect of the safe operating area.

$$I_{DRMS} = \sqrt{(P_B/R_{DS(on)})} \qquad \text{Eq. (4)}$$

In block 422, the controller 104 calculates the FBSOA and RBSOA pulse current ($I_{DM}$) boundary as a function of duty cycle D, switching frequency f, junction temperature $T_j$, and reliability (i.e., mean time between failures MTBF or another suitable reliability characteristic), in accordance with equation (5) below, and this information is used (block 424) to adjust default pulse current threshold $I_{DM}$, back at step 402.

$$I_{DM} = I_{DM}(D, f, T_j, MTBF) \qquad \text{Eq. (5)}$$

In block 426, the controller 104 calculates the FBSOA drain to source on-state resistance $R_{DS(on)}$-limited boundary using normalized on state resistance $R_{DS}(ON)$ as a function of junction temperature, in accordance with equation (6) below, and this data is used (block 428) to adjust the FBSOA boundary limited by $R_{DS(on)}$, back at step 402

$$I_D = V_{DS}/R_{DS(on)}R_{DS}(ON) \qquad \text{Eq. (6)}$$

The invention also provides a diagnostics and prognostics method that helps to self-diagnose and/or predict errors in a power device, such as the ISPS 100. For example, this self-diagnosis and prediction permits the ISPS 100 to detect and/or predict defects that include (but are not limited to) die, die bonding, die attachment and device package mounting defects. The diagnostics and prognostics method provides an advance warning that may help to prevent preventing catastrophic failures and increase reliability of both the power device itself and any system in which it is installed. One implementation of a self-diagnostics and prognostics method 500 is illustrated in FIG. 14.

Figure 14:
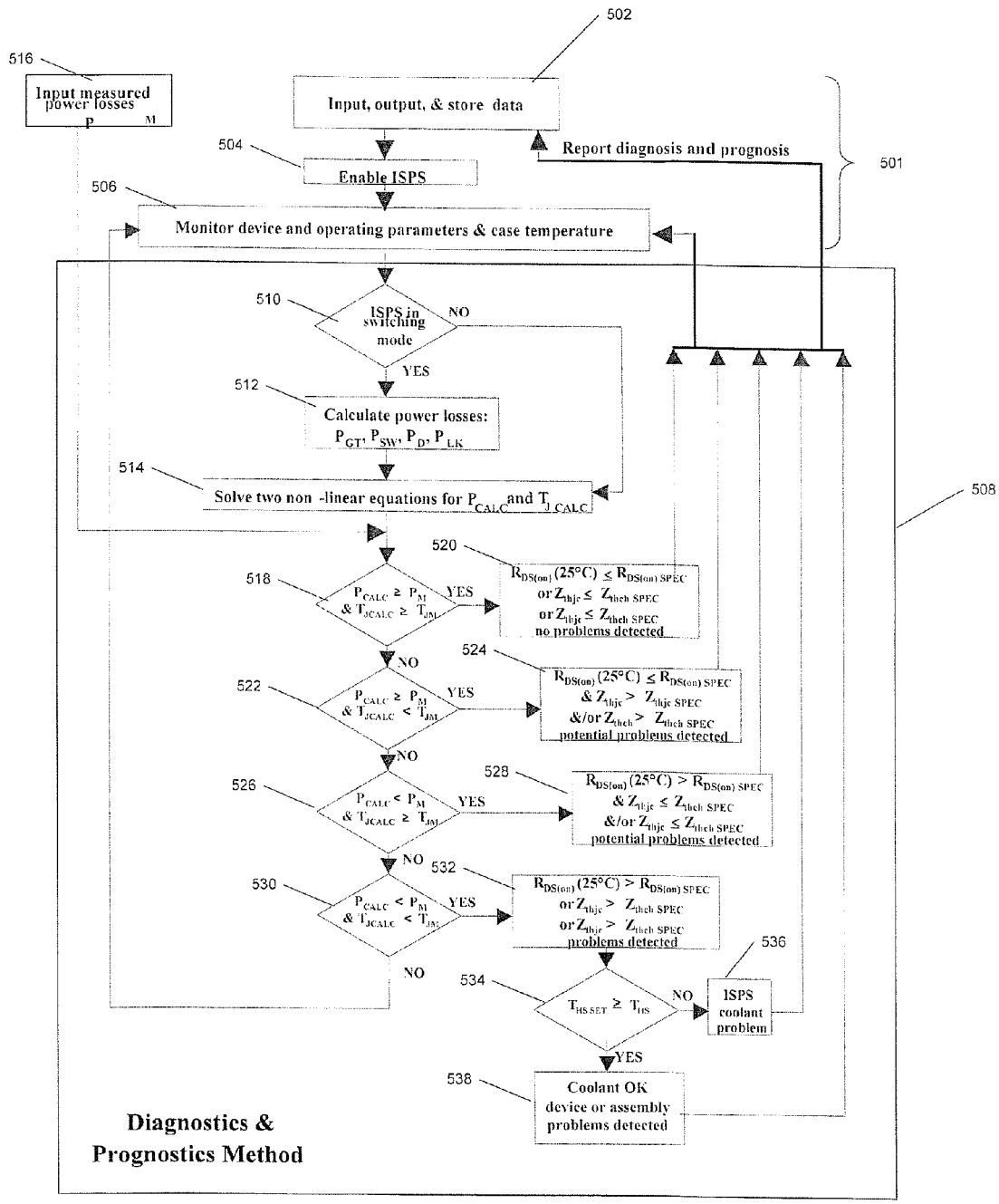
FIG. 14 is a flowchart of a method for diagnosing and predicting errors for a power device, in accordance with one embodiment of the invention.

If the self diagnostics and prognostics method 500 of FIG. 14 is implemented as part of the control method 200 of FIG. 9, then the blocks that are part of block 501 (which includes blocks 502, 504, 506) are actually accomplished via blocks 210-230 of FIG. 9, and the self diagnostics and prognostics method 500 begins after block 506 in FIG. 14, as the Diagnostics and Prognostics Method 508.

Else, if the self-diagnostics and prognostics method 500 is implemented as a stand-alone method, blocks 502, 504, and 506 are executed. The "Input, Output, and Store Data" functions performed in block 502 of FIG. 14 are substantially the same as the "Receive (and Optionally Store) Device Data" functions of block 210 of FIG. 9, and the description provided above for block 210 is applicable to block 502. The "enable ISPS" functions of block 504 of FIG. 14 are substantially the same as the "Enable ISPS" functions of block 220 of FIG. 9, and the description provided above for block 220 is applicable to block 504. Likewise, the "Monitor device and operating parameters and case temperature" functions of block 506 of FIG. 14 are substantially the same as the "Monitor Device and Operation Parameters" functions of block 230 of FIG. 9, and the description provided above for block 230 is applicable to block 506.

Referring to FIGS. 7, 8, and 14, the controller 104 checks whether the ISPS 100 is in switching mode (block 510). If the controllable semiconductor 102 operates in the linear mode, the method skips to block 514. If, however, the controllable semiconductor 102 is in switching mode, the controller 104 calculates power losses, including gate power dissipation $P_{GT}$, switching dissipation $P_{SW}$, integral body diode power dissipation $P_D$, and transistor leakage power dissipation $P_{LK}$. (Block 512). Each of these calculations is discussed further below. Equation (7) is used to calculate gate power dissipation $P_{GT}$:

$$P_{GT} = 1/T \int |V_{GS}(t)||I_G(t)| dt \text{ for integration time interval from 0 to T} \quad \text{Eq. (7)}$$

For equations (7) through (12), the time interval T is defined as follows: If the controllable semiconductor 102 is switching with fixed frequency, the time interval T is the period of the switching frequency. If the controllable semiconductor 102 operates with variable frequency, the power dissipation of the controllable semiconductor 102 is found by averaging losses defined in equations (7) through (12) over an operating time interval that includes a number of turn on and turn off events. Equation (8) is used to calculate switching power dissipation $P_{SW}$:

$$P_{SW} = 1/T \int V_{DS}(t) I_D(t) dt \text{ for } V_{DS}>0, I_D>0 \text{ and integration time interval from } t_1 \text{ to } t_2 \quad \text{Eq. (8)}$$

where: $t_1$ is defined as the moment in time when $i_g > 0.1\ I_{gpk}$ for positive $i_g$ and $V_{DS} < 0.1\ V_{DSS}$ $t_2$ is defined as the moment in time when $i_g < 0.1\ I_{gpk}$ for negative $i_g$ and $I_{DS} < 0.1\ V_{DSS}$ Other criteria for defining the integration time interval can be used without affecting the substance of this invention.

Equations (9) through (11) are used to calculate integral body diode power dissipation $P_D$ $$P_D = P_{D\ COND} + P_{D\ SW}(t) \quad \text{Eq. (9)}$$

$$P_{D\ COND} = 1/T \int V_{DS}(t) I_D(t) dt \text{ for } V_{DS}<0, I_D<0 \text{ and integration time interval from 0 to T} \quad \text{Eq. (10)}$$

$$P_{D\ SW} = Q_{rr}/T \int V_{DS}(t) dt \text{ for integration time interval from 0 to } t_{rr} \quad \text{Eq. (11)}$$

where $Q_{rr}$ is reverse recovery charge $t_{rr}$ is reverse recovery time

Equation (12) is used to calculate leakage power dissipation $P_{LK}$ $$P_{LK} 1/T \int V_{DS}(t) I_D(t) dt \text{ for } V_{DS}=V_{DD}\ 0, I_D>0 \text{ and integration time interval from 0 to T} \quad \text{Eq. (12)}$$

In block 514, the controller 104 solves two non-linear equations (Equations (13) and (14) below, respectively) for the power loss $P_{CALC}$ and junction temperature $T_{JCALC}$ using a numeric procedure similar to that described in R. Severns (Ed. in Chief), *MOSPOWER Applications Handbook*, Siliconix Inc., 1984, pp. 4-17 to 4-21, which is hereby incorporated by reference:

$$P_{CALC} = P_G + P_{SW} + P_D + P_{LK} + I_{RMS}^2 R_{DS(on)(25°\ C.)} R_{DSN} \quad \text{Eq. (13)}$$

$$T_{JCALC} = T_{HS} + P_{CALC}(Z_{thhc} + Z_{thjc}) \quad \text{Eq. (14)}$$

Measured transistor power dissipation $P_M$ is accessed ($P_M$ can be determined and/or acquired in many different ways, including from protection method 300, block 313, from the protection algorithm. Calculated and measured power dissipation and junction temperature are compared in blocks 518, 522, 526, and 530. Note that blocks 518, 522, 526, and 530 can be performed in any order; the illustrated order is provided by way of example and is not limiting.

If $P_{CALC} \geq P_M$ and if $T_{JCALC} \geq T_{JM}$, (block 518) then the conditions of block 520 are presumed to exist (i.e., the on state resistance $R_{DS(on)}$ is within limits, as are the thermal impedances $Z_{thhc}$ and $Z_{thjc}$). The ISPS 100 is presumed to have no problems and the method jumps back to block 506. Optionally, the prognosis and diagnosis information also can be reported as part of the feedback to block 502.

If $P_{CALC} \geq P_M$ and & $T_{JCALC} \leq T_{JM}$, (block 522) the on state resistance $R_{DS(on)}$ is within limits, but the thermal interface impedance, including either $Z_{thhc}$ or $Z_{thjc}$ or both $Z_{thhc}$ and $Z_{thjc}$ exceeds specified values (block 524). Because higher thermal impedance will result in a higher junction temperature, the $R_{DS(on)}$ will increase till the device reaches thermal equilibrium. Thus, the detected condition has a transient nature and will diagnose thermal interface problem for some pulsed loads or for a fixed load during turn on. The prognosis is reduced device reliability and potential failure under high power load. The prognosis and diagnosis information can be reported as part of the feedback to block 502, and the method itself jumps back to block 506.

If $P_{CALC} \leq P_M$ and & $T_{JCALC} \geq T_{JM}$, (block 526) the situation described above for block 522 is reversed. With this condition, the combined thermal impedance $Z_{thhc}+Z_{thjc}$ is less than specified, but the on state resistance $R_{DS(on)}$ is higher than normal (block 528). These conditions diagnose either the die or die connections defect and the prognosis is reduced device reliability and potential failure under high current or high power load. The prognosis and diagnosis information can be reported as part of the feedback to block 502, and the method itself jumps back to block 506.

If $P_{CALC} < P_M$ and & $T_{JCALC} < T_{JM}$, (block 530), the ISPS 100 may have any of the defects described above, i.e. either the combined thermal impedance or on state resistance or both thermal impedance and on state resistance are higher than normal (block 532). These conditions can indicate either a die or die connections defect in the controllable semiconductor 102. The prognosis is reduced device reliability and potential failure under either high current or high power load. The prognosis and diagnosis information can be reported as part of the feedback to block 502.

In block 534, heat sink temperature $T_{HS}$ is compared with expected temperature $T_{HS\ SET}$ determined from the function $T_{HS}(P_M)$. If the heat sink temperature is greater than expected for the measured power dissipation, a heat sink or heat sink cooling problem is reported (block 536), and the method itself jumps back to block 506; otherwise, block 538 is performed. Note that blocks 534 and 536 can be performed at virtually any time after block 506, including before any of blocks 510-532 or between any of them, and showing blocks 534 and 536 performed at this point in the diagnostics and prognostics method 500 is provided by way of example and is not limiting.

In a further aspect, the invention also provides a method of calibrating installed power devices, such as the ISPS 100 of FIGS. 7 and 8. This method relies at least in part on the dependence of the ISPS 100's power handling capability of its case to heat sink thermal impedance. That is, the design and operation of the ISPS 100 permits it to be calibrated when installed, based on its mounting and power handling capability.

Figure 15:
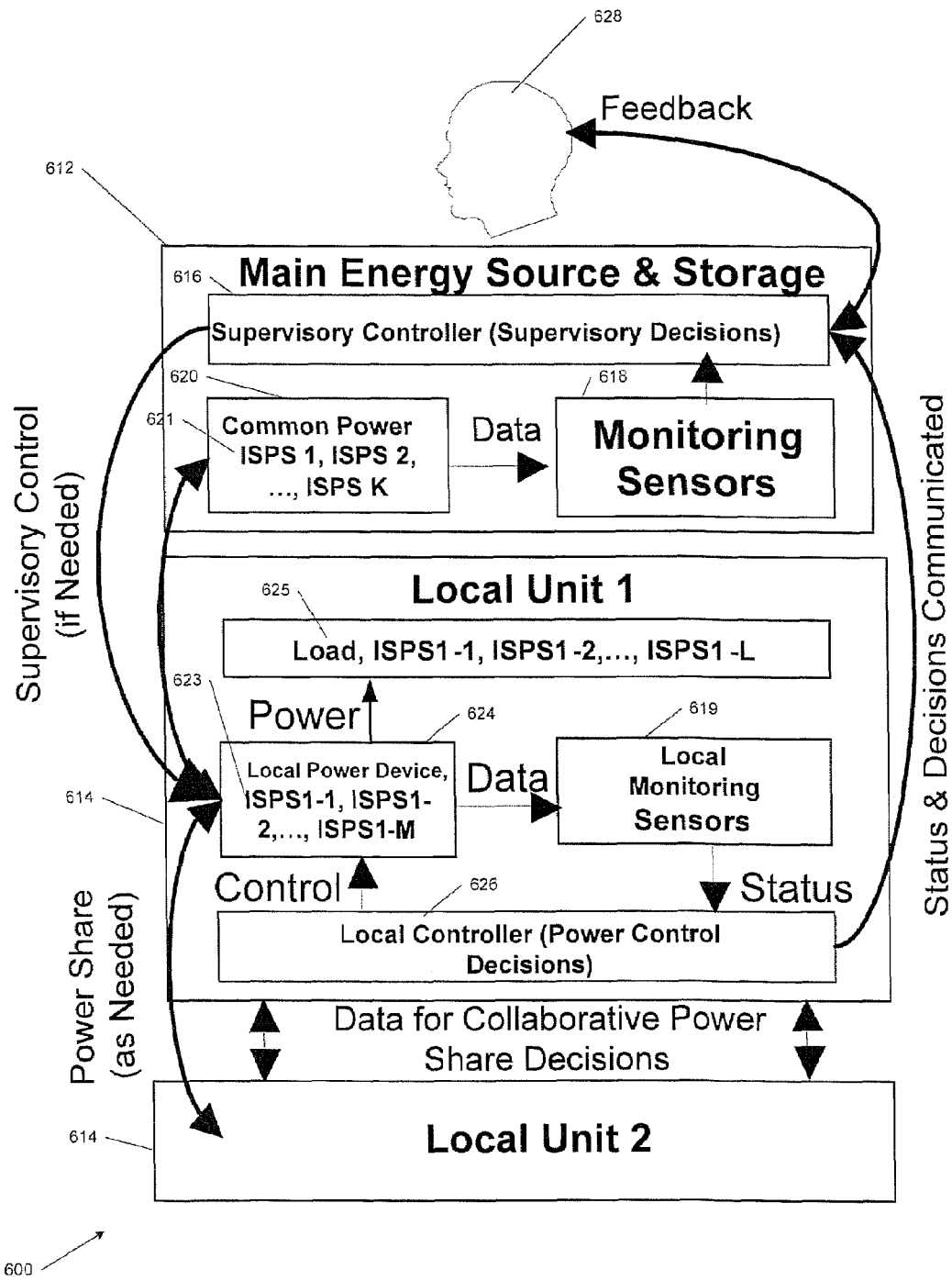
FIG. 15 is a first illustrative block diagram of an intelligent power system with decentralized control and integrated smart power switches, in accordance with one embodiment of the invention.

FIG. 15 is a first illustrative block diagram of an intelligent power system 600 having installed power devices, with decentralized control and integrated smart power switches, in accordance with one embodiment of the invention. The system 600 is an intelligent, reconfigurable system capable of working with any number of loads and decentralized, as opposed to hierarchical, control.

The intelligent power system 600 of FIG. 15 with three-level distributed control includes a supervisory system 612, containing a main energy source and storage, which can control and be in communication with one or more local power subsystems 614. Each local power subsystem 614 includes a load and a multiplicity of ISPSs 100 of FIGS. 7 and 8. Each local power subsystem 614 controls certain aspects of its operation (via a local controller 626 that makes power control decisions and communicates with other local controllers), communicates status and operating decisions to the supervisory system 612 (again, via the local controller 626) and can, if needed, receive supervisory control from the supervisory system 612. The supervisory system 612 can, as needed, enable power sharing between each power subsystem 614.

The supervisory system 612 includes supervisory controller 616, one or more monitoring sensors 618, and a plurality of ISPSs that enable control of the common power 620. The common power 620 represents the set of one or more power sources 621 capable of satisfying needs of substantially all local power subsystems 614. Each local power subsystem 614 includes one or more local power devices 623 (similar to the controllable semiconductor 102 described previously) providing data to one or more local monitoring sensors, which communicate information to the local controller 626. In the supervisory system 612, the monitoring sensors 618 acquire data from the common power 620 and communicate the data to the supervisory controller 616.

When the local power subsystems 614 are connected to loads 625, the supervisory controller 616 sends a turn-on (enabling) pulse of predetermined width to all local power subsystems 614. The power devices 623 are loaded for the duration of the pulse and, via the local monitoring sensors 619, monitor and report their case temperature rise to the local controller 626. The local controller 626 reports this information to the supervisory controller 616. The expected case temperature rise is based on the specified case to heat sink thermal impedance that is accessed by supervisory controller 616 and is stored in the local controller 626's memory, as well as on the power dissipation of each local power subsystem 614. Thus, all local power subsystems 614 are mapped according to their case temperature rise and, ultimately, power handling capability. As an example, mapping, in this context, includes a situation where, in a circuit diagram showing connections of the overall power system, each ISPS has a corresponding number identifying its power handling capability, e.g. statistically average, above average and below average. Mapping enables the supervisory controller 616 to determine how best to share power amongst each local power subsystem 614. Because devices with higher than expected case temperature rise might have mounting defects, mapping the local power subsystems also provides an opportunity to identify them for corrective maintenance.

Thus, in one embodiment, the invention provides a method of determining the power handling capability of an installed device, such as a power device. measuring a temperature of the installed device. A predicted temperature change (e.g., a temperature rise) is determined for the installed device, where the predicted temperature change is expected as a result of a test pulse. A test pulse is sent to the installed device. The actual temperature change of the installed device as a result of the test pulse is measured. The actual temperature change is compared to the predicted temperature change. The comparison of the actual temperature change to the predicted temperature change can be used to determine the power handling capability of the installed device. Based on the knowledge of the power handling capability of the installed device, action can be taken such as assigning a load to the installed device, based at least in part on the power handling capability, adjusting a load operably coupled to the installed device, based at least in part on the power handling capability, and/or redistributing a load operably coupled to the installed device, based at least in part on the power handling capability.

After mapping, each local subsystem 614 operates using two levels of control, with each local controller 626 communicating with other local controllers and supervising local ISPSs that continue making SOA decisions, providing self-diagnostics, etc. In the system 600, however (which, by way of example only, has three levels of control) decisions concerning overall power flow, resolution of conflicts between local controllers 626, and processing of the status information from each local subsystem are performed by the supervisory controller 616, which can respond by (for example), switching over some or all of the power capacity of the local subsystem 614 to another local subsystem, over-riding a shutdown of the local subsystem 614, providing feedback to an external user 628 about reported and/or predicted errors, etc.

Figure 16:
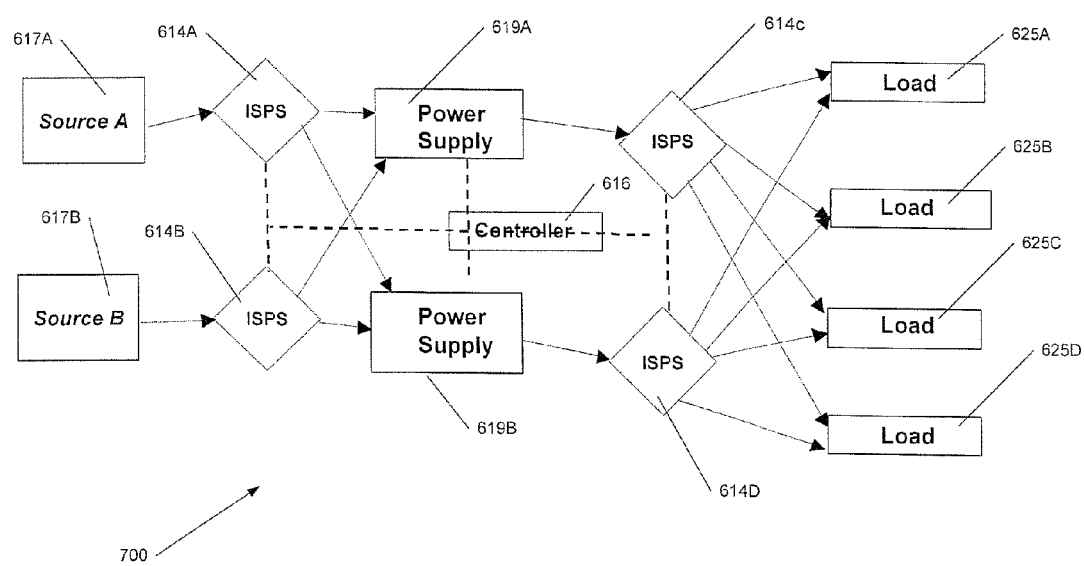
FIG. 16 is a second illustrative block diagram of an intelligent power system, in accordance with one embodiment of the invention.

FIG. 16 is a cascaded power system 700 with two-level control that provides a further implementation of the intelligent power system 600 of FIG. 15 and shows showing how a plurality of ISPS devices can be cascaded together. In FIG. 16, the controller 616 supervises four ISPS devices: ISPS 614A, 614B, 614C, and 614D. ISPS 614A is powered by power source 617A and is used to power the power supply 619A. Similarly, ISPS 614B is powered by power source 617B and is used to power the power supply 619B. Power supply 619A powers ISPS 614C and power supply 619B powers ISPS 614D. ISPS 614C and ISPS 614D each can provide power to the loads 625A, 625B, 625C, and 625D. The controller 616 provides power flow control (including power sharing) amongst all the elements of the cascaded power system 700 and monitors each ISPS 614 to help prevent/reduce single point failures. However, most details of this monitoring and control are part of the algorithm that is specific for each system.

Figure 17:
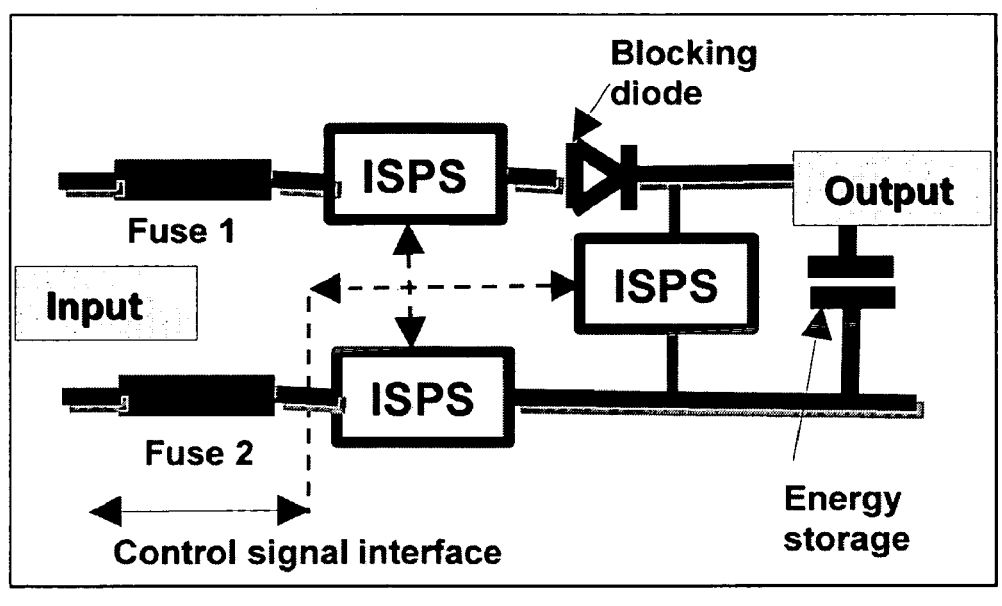
FIG. 17 is an illustration of an application of an intelligent power system, in accordance with one embodiment of the invention.

FIG. 17 is another application of the ISPS described herein. FIG. 17 illustrates a simpler, single-level control with an ISPS-based switch and discharge circuit 800 that can be used for a direct current (DC) bus having an energy storage unit. In this application, the ISPS reduces number of interconnect signals, improves performance (safety, speed of response, and system-level reliability), and adds functionality (using the methods described in FIGS. 9, 10, 13, and 15 herein.)

One or more embodiments of the invention could be adapted to work in many different types of power systems, including but not limited to the aforementioned "Intelligent Power System," Ser. No. 10/692,580, filed Oct. 24, 2003, inventors Boris S. Jacobson et al., published as U.S. 2004/0095023 on May 20, 2004, which is incorporated by reference in its entirety.

As the above description and associated Figures show, the invention provides systems, methods, and devices for power systems that provide self-diagnosis of faults, prediction of potential faults, calibration of installed devices/systems and dynamic self-adjustment of operating parameters, all of which take into account actual operating conditions. At least some embodiments of the invention provide the ability to determine if anything is wrong with power devices that appear to be working. In addition, at least some embodiments of the invention provide methods of inspecting and calibrating installed transistors according to their power handling capability.

In the Figures of this application, in some instances, a plurality of system elements or method blocks may be shown as illustrative of a particular system element, and a single system element or method block may be shown as illustrative of a plurality of a particular systems elements or method blocks. It should be understood that showing a plurality of a particular element or block is not intended to imply that a system or method implemented in accordance with the invention must comprise more than one of that element or block, nor is it intended by illustrating a single element or block that the invention is limited to embodiments having only a single one of that respective elements or blocks. In addition, the total number of elements or blocks shown for a particular system element or method is not intended to be limiting; those skilled in the art can recognize that the number of a particular system element or method blocks can, in some instances, be selected to accommodate the particular user needs.

Also in the Figures, for drawings, flow charts, and/or flow diagrams illustrating methods or processes, rectangular blocks are "processing blocks" that can represent one or more instructions (or groups of instructions), such as computer software instructions. The diamond shaped blocks are "decision blocks," that one or more instructions (or groups of instructions), such as computer software instructions, that affect the execution of the computer software instructions represented by the processing blocks. Alternatively, the processing and decision blocks represent actions performed by functionally equivalent circuits such as a digital signal processor circuit, a microcontroller, or an application specific integrated circuit (ASIC). Further, actions and blocks can be implemented using combinations of hardware and software.

The drawings, flow charts, block diagrams, and flow diagrams do not depict the syntax of any particular programming language. Rather, the drawings, flow charts, block diagrams, and flow diagrams flow illustrate the functional information one of ordinary skill in the art requires to fabricate circuits and/or to generate computer software to perform the processing required in accordance with the present invention. Note that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention. Thus, unless otherwise stated the steps described herein are unordered meaning that, when possible, the steps can be performed in any convenient or desirable order.

Additionally, the software used to implement all or part of the invention may be embodied in a computer program product that includes a computer useable medium. For example, such a computer usable medium can include a readable memory device, such as a hard drive device, a CD-ROM, a DVD-ROM, or a computer diskette, having computer readable program code segments stored thereon. The computer readable medium can also include a communications link, either optical, wired, or wireless, having program code segments carried thereon as digital or analog signals.

In describing the embodiments of the invention illustrated in the figures, specific terminology (e.g., language, phrases, product brands names, etc.) is used for the sake of clarity. These names are provided by way of example only and are not limiting. The invention is not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, elements, circuits, modules, tables, software modules, systems, etc. Such terminology used herein, however, is for the purpose of description and not limitation.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention.

Having described and illustrated the principles of the technology with reference to specific implementations, it will be recognized that the technology can be implemented in many other, different, forms, and in many different environments. The technology disclosed herein can be used in combination with other technologies. Accordingly, it is submitted that that the invention should not be limited to the described embodiments but rather should be limited only by the spirit and scope of the appended claims. In addition, all publications and references cited herein are expressly incorporated herein by reference in their entirety.

The invention claimed is:

1. A device comprising:
    a controllable semiconductor device, the controllable semiconductor device associated with a first operating parameter and a second operating parameter, wherein at least the first operating parameter is a parameter that is controllable while the controllable semiconductor device is operating;
    a first sensor in communication with the controllable semiconductor device, the first sensor acquiring data relating to the second operating parameter of the controllable semiconductor device; and
    a controller in communication with the controllable semiconductor device, a storage device, and the first sensor, the controller configured to access device data associated with the controllable semiconductor and stored in the storage device, control the first operating parameter of the controllable semiconductor while the controllable semiconductor is operating, and receive data from the first sensor relating to the second operating parameter;
    wherein the device data comprises at least one of a default drain to source voltage ($V_{DS}$) boundary, a default power boundary ($P_B$), a default RMS current boundary ($I_{DRMS}$), and a default $R_{DS(on)}$ limited current boundary; and
    wherein the controller is configured to determine a first predicted value dependent on the device data, compare the data from the first sensor relating to the second operating parameter with the first predicted value, and, if a first condition is detected based on this comparison, dynamically determine a safe operating area (SOA) condition for the controllable semiconductor device based on the first condition, the device data, and on a predetermined reliability characteristic of the controllable semiconductor device and to dynamically modify the first operating parameter, while the controllable semiconductor is operating, so as to ensure that the controllable semiconductor operates in accordance with both the SOA condition and with the predetermined reliability characteristic.

2. The device of claim 1, wherein the controllable semiconductor comprises at least one of a power transistor, a static induction transistor (SIT), a thyristor, an MOS-controlled thyristor (MCT), a gate turnoff (GTO) thyristor, and an emitter turnoff (ETO) thyristor.

3. The device of claim 1, wherein the first sensor comprises at least one of a temperature sensor, a voltage sensor, and a current sensor.

4. The device of claim 1, wherein the first operating parameter comprises at least one parameter selected from the group consisting of gate drive, base drive, a transistor bias, a safe operating area (SOA) condition, a drain to source voltage threshold ($V_{DS}$), an RMS drain current threshold ($I_{DRMS}$), a forward and reverse bias safe operating area (SOA) pulse current threshold, ($I_{DM}$), a forward bias SOA drain current ($I_D$) boundary limited by drain to source on resistance ($R_{DS(on)}$), and an operating area of power device; drain to source voltage, collector to emitter voltage, -anode to cathode voltage, gate voltage, gate current, base current, average drain device current, average collector device current, average anode device current, peak drain current, peak collector current, peak anode current, RMS drain current, RMS collector current, RMS anode current, switching frequency, duty cycle.

5. The device of claim 1, further comprising a second sensor acquiring data relating to a third operating parameter of the controllable semiconductor, the second sensor in communication with the controller and the controller receiving data relating to the third operating parameter from the second sensor;
wherein the controller is configured to determine a predicted third operating parameter dependent on the stored device data, compare the data relating to the third operating parameter with the predicted third operating parameter, and, if a first condition is detected, dynamically determine the SOA condition for the controllable semiconductor based on the first condition, the device data, and on the predetermined reliability characteristic of the controllable semiconductor device and dynamically modify the first operating parameter while the controllable semiconductor device is operating, so as to ensure that the controllable semiconductor device operates in accordance with both the SOA condition and the predetermined reliability characteristic.

6. The device of claim 1, wherein the at least one of the first sensor and controller is configured to acquire the data relating to the second operating parameter at least one of periodically and substantially continuously.

7. The device of claim 1, wherein the second operating parameter comprises at least one operating parameter selected from the group consisting of a gate drive, base drive, a transistor bias, the safe operating area (SOA) condition, a drain to source voltage threshold ($V_{DS}$), an RMS drain current threshold ($I_{DRMS}$), a forward and reverse bias safe operating area (SOA) pulse current threshold, ($I_{DM}$), a forward bias SOA drain current ($I_D$) boundary limited by drain to source on resistance ($R_{DS(on)}$), an operating area of the power device, drain voltage, gate voltage, gate current, average drain device current, peak drain current, RMS drain current, die temperature, case temperature, junction temperature ($T_J$), switching frequency, and duty cycle.

8. The device of claim 1, wherein the first condition comprises at least one of over-temperature, current tunneling, excessive power, over-current, over-voltage, a coolant problem, a heat sink problem, a die defect, a die interconnect bonding defect, a die attachment defect, and a device package mounting defect.

9. The device of claim 8 wherein the controller is configured to perform an action upon detection of the first condition.

10. The device of claim 9, wherein the action comprises at least one of:
(a) modifying operation of the controllable semiconductor;
(b) shutting down the controllable semiconductor;
(c) interrupting operation of the controllable semiconductor;
(d) switching an operation mode of the controllable semiconductor;
(e) checking a different second operating parameter;
(f) diagnosing the first condition;
(g) determining whether a second condition could occur based on the first condition, the second condition comprising at least one of over-temperature, current tunneling, excessive power, over-current, over-voltage, a coolant problem, a heat sink problem, a die defect, a die bonding defect, a die attachment defect, a device package mounting defect, a thermal interface problem for the power device, a reduced reliability of the power device, a failure of the power device under high current load, and a failure of the power device under high power load; and
(h) providing a notification.

11. The device of claim 1, wherein the first sensor monitors the controllable semiconductor at more than one location.

12. The device of claim 1, wherein the device data information further comprises at least one of: breakdown drain to source voltage $BV_{DSS}$, breakdown drain to source voltage $BV_{DSS\_p}$ protection threshold, rated drain to source voltage $V_{DSS}$, rated drain to source voltage $V_{DSS}$ protection threshold, maximum single pulse current $I_{DM}$, maximum single pulse current $I_{DM}$ protection threshold, continuous drain current $I_D$, continuous drain current $I_D$ protection threshold, avalanche current $I_{AR}$, avalanche current $I_{AR}$ protection threshold, default Forward Biased Safe Operating Area (FBSOA) for a single pulse at a predetermined junction temperature $T_j$, default Reverse Biased Safe Operating Area (RBSOA) for a for a single pulse at a predetermined junction temperature $T_j$, a junction-to-case transient thermal impedance curve for at least one of normal and avalanche modes, heat sink to case thermal impedance $Z_{thhc}$, junction to case thermal impedance $Z_{thjc}$, on state resistance at a predetermined temperature T ($R_{DS(on)(at\ temp\ T)}$, normalized on state resistance $R_{DS}(ON)$ versus temperature, heat sink temperature $T_{HS}$ as a function of dissipated power $T_{HS}(P_M)$, junction temperature $T_J$ threshold, reverse recovery charge of the integral body diode $Q_{rr}$ and reverse recovery time $t_{rr}$, of the integral body diode $Q_{rr}$.

13. The device of claim 1, wherein:
the controllable semiconductor comprises a field effect transistor (FET) having a drain electrode, a gate electrode, and a source electrode; and
the controller comprises a first output providing a gate drive signal to the gate electrode of the controllable semiconductor and a first input coupled to the first sensor so as to permit the controller to receive data relating to the second operating parameter.

14. The device of claim 13, wherein the controller further comprises a second input, the second input adapted for receiving bias power to provide a source for the gate drive signal.

15. The device of claim 14, wherein the controller further comprises a third input adapted to receive the device data associated with the controllable semiconductor.

16. The device of claim 15, wherein the controller further comprises a second output, the second output comprising a notification signal.

17. The device of claim 16, wherein the notification signal comprises information relating to at least one of an operating mode of the controllable semiconductor, a status of the controllable semiconductor, the first condition, a fault notification, and a fault prediction.

18. The device of claim 1, wherein the predetermined reliability characteristic comprises at least one of a mean time between failures (MTBF) and a failure rate.

19. The device of claim 1, wherein the SOA condition is defined by a set of boundaries, the set of boundaries comprising an SOA drain to source voltage ($V_{DS}$) boundary, SOA power boundary ($P_B$), SOA root-mean-square (RMS) current boundary ($I_{DRMS}$), and SOA $R_{DS(on)}$ limited current boundary, where the controller is further configured to adjust at least one of the boundaries in the set of boundaries based on the data relating to the second operating parameter.

20. The device of claim 7, wherein the second operating parameter comprises the SOA condition and wherein the device data comprises at least one of a junction-to-case transient thermal impedance curve for at least one of normal and avalanche modes, heat sink to case thermal impedance $Z_{thhc}$, junction to case steady state thermal impedance $Z_{thjc}$, on state resistance at a predetermined temperature T ($R_{DS(on)(at\,temp\,T)}$, normalized on state resistance $R_{DS}(ON)$ versus temperature.

21. The device of claim 1, wherein the device data information further comprises at least one of: breakdown drain to source voltage $BV_{DSS}$, breakdown drain to source voltage $BV_{DSS}$, protection threshold, rated drain to source voltage $V_{DSS}$, rated drain to source voltage $V_{DSS}$ protection threshold, maximum single pulse current $I_{DM}$, maximum single pulse current $I_{DM}$ protection threshold, continuous drain current $I_D$, continuous drain current $I_D$ protection threshold, avalanche current $I_{AR}$, avalanche current $I_{AR}$ protection threshold, default Forward Biased Safe Operating Area (FBSOA) for a single pulse at a predetermined junction temperature $T_j$, default Reverse Biased Safe Operating Area (RBSOA) for a single pulse at a predetermined junction temperature $T_j$; on state resistance at a predetermined temperature T ($RDS_{(on)(at\,temp\,T)}$, normalized on state resistance $RDS_{(ON)}$ versus temperature, heat sink temperature $T_{HS}$ as a function of dissipated power $T_{HS}(P_M)$, junction temperature $T_J$ threshold, reverse recovery charge of the integral body diode $Q_{rr}$ and reverse recovery time $t_{rr}$, of the integral body diode $Q_{rr}$.

22. The device of claim 1, wherein:
the first operating parameter comprises one or more parameters selected from the group consisting of drain-to-source voltage threshold ($V_{DS}$); RMS drain current threshold ($I_{DRMS}$); pulse current threshold ($I_{DM}$); a forward bias SOA drain current ($I_D$) boundary limited by drain to source on resistance ($R_{DS(on)}$); and
the second operating parameter comprises one or more parameters selected from the group consisting of case temperature ($T_c$); junction temperature ($T_j$); and characteristics of a load operably coupled to the device.

23. The device of claim 1, where the controller is further configured to:
compute, for each respective junction temperature of the controllable semiconductor in a predetermined range of temperatures, a set of boundaries, each respective boundary based on the device data for the controllable semiconductor and on the predetermined reliability characteristic as a function of drain current $I_D$ and drain to source voltage $V_{DS}$ for the controllable semiconductor, wherein each respective boundary defines a respective SOA;
select a SOA based on a desired predetermined reliability characteristic; and
dynamically modify the first operating parameter in accordance with the respective boundary associated with the selected SOA and predetermined reliability characteristic.

24. The device of claim 23, wherein the predetermined reliability characteristic comprises mean time between failures (MTBF) and wherein the computed set of boundaries includes at least one boundary defining a minimum SOA that corresponds to a maximum MTBF and at least one boundary defining maximum SOA that corresponds to a minimum MTBF.

25. A device comprising:
a controllable semiconductor device, the controllable semiconductor device associated with a first operating parameter and a second operating parameter, wherein at least the first operating parameter is controllable while the controllable semiconductor is operating;
a first sensor in communication with the controllable semiconductor device, the first sensor acquiring data relating to the second operating parameter of the controllable semiconductor device; and
a controller in communication with the controllable semiconductor device, a storage device, and the sensor, the controller configured to access device data associated with the controllable semiconductor and stored in the storage device, control the first operating parameter of the controllable semiconductor while the controllable semiconductor is operating, and receive data from the first sensor relating to the second operating parameter;
wherein the device data comprises at least one of a junction-to-case transient thermal impedance curve for at least one of normal and avalanche modes, heat sink to case thermal impedance $Z_{thhc}$, junction to case steady state thermal impedance $Z_{thjc}$, on state resistance at a predetermined temperature T ($R_{DS(on)(at\,temp\,T)}$, normalized on state resistance $R_{DS}(ON)$ versus temperature; and
wherein the controller is configured to determine a first predicted value dependent on the device data, compare the data from the first sensor relating to the second operating parameter with the first predicted value, and, if a first condition is detected based on this comparison, to dynamically determine a safe operating area (SOA) condition for the controllable semiconductor based on the first condition, the device data, and on a predetermined reliability characteristic of the controllable semiconductor and dynamically modify the first operating parameter while the controllable semiconductor is operating, so as to ensure that the controllable semiconductor operates in accordance with both the SOA condition and the predetermined reliability characteristic of the controllable semiconductor.

26. The device of claim 25, wherein the predetermined reliability characteristic comprises at least one of a mean time between failures (MTBF) and a failure rate.

27. The device of claim 25, wherein the first operating parameter comprises at least one of drain to source voltage, collector to emitter voltage, anode to cathode voltage, gate voltage, gate current, base current, average drain device current, average collector device current, average anode device current, peak drain current, peak collector current, peak anode current, RMS drain current, RMS collector current, RMS anode current, die temperature, case temperature, junction temperature ($T_J$), switching frequency, and duty cycle.

28. The device of claim 25, wherein the second operating parameter comprises at least one of a gate drive, base drive, a transistor bias, the safe operating area (SOA) condition, a drain to source voltage threshold (VDS), an RMS drain current threshold (IDRMS), a forward and reverse bias safe operating area (SOA) pulse current threshold, (IDM), a forward bias SOA drain current (ID) boundary limited by drain to source on resistance (RDS(on)),and an operating area of the power device.

29. The device of claim 25, wherein the first condition comprises at least one of over-temperature, current tunneling, excessive power, over-current, over-voltage, a coolant problem, a heat sink problem, a heat sink to device package interface problem, a die defect, a die interconnect bonding defect, a die attachment defect, and a device package mounting defect.

30. A controllable power switch, comprising:
a semiconductor device, the semiconductor device controllable to be in one of a linear mode, a switching mode, and a shutdown mode;
a first sensor in operable communication with the semiconductor device, the first sensor configured to monitor a die temperature of the controllable semiconductor, where the first sensor acquires temperature data from at least two different locations on a die of the semiconductor device, at least one of the locations being substantially near the periphery of the die and at least one of the locations being substantially near the center of the die;
a second sensor acquiring data relating to a first controllable operating parameter of the semiconductor device, the second sensor in communication with the controller so as to provide to the controller data relating to the first controllable operating parameter;
a controller in operable communication with the semiconductor device, a storage device, and the first sensor, the controller configured to access first and second device data associated with the semiconductor device and stored in the storage device, control the mode of the semiconductor device, and receive data from the first sensor relating to the die temperature;
wherein the first device data comprises a junction-to-case transient thermal impedance curve for at least one of normal and avalanche modes; heat sink to case thermal impedance $Z_{thhc}$; junction to case thermal impedance $Z_{thjc}$; on state resistance at a predetermined temperature T ($R_{DS(on)(at\ temp\ T)}$, normalized on state resistance $R_{DS}$ (ON) versus temperature; heat sink temperature $T_{HS}$ as a function of dissipated power $T_{HS}(P_M)$; and junction temperature $T_J$ threshold;
wherein the second device data further comprises at least one of a default drain to source voltage ($V_{DS}$) boundary, a default power boundary ($P_B$), a default RMS current boundary ($I_{DRMS}$), and a default $R_{DS(on)}$ limited current boundary;
wherein the controller is configured to determine, based on the first device data and the die temperature data, whether current tunneling; exists and, if current tunneling exists, the controller is configured to change the mode of the semiconductor device; and
wherein the controller is configured to determine, based on the data from the first sensor, the data from the second sensor, and the second device data, whether a second condition exists and, if the second condition exists, determine a safe operating area (SOA) condition for the semiconductor device based on the first condition, the device data, and on a predetermined reliability characteristic of the semiconductor device and dynamically modify the first controllable operating parameter while the semiconductor device is operating, so as to ensure that the semiconductor device operates in accordance with both the SOA condition and the predetermined reliability characteristic of the semiconductor device.

31. The controllable power switch of claim 30 wherein the predetermined reliability characteristic comprises at least one of a mean time between failures (MTBF) and a failure rate.

32. The controllable power switch of claim 30, wherein the first operating parameter comprises at least one of drain to source voltage, collector to emitter voltage, anode to cathode voltage, gate voltage, gate current, base current, average drain device current, average collector device current, average anode device current, peak drain current, peak collector current, peak anode current, RMS drain current, RMS collector current, RMS anode current, die temperature, case temperature, junction temperature ($T_j$), switching frequency, and duty cycle.

33. A device comprising:
a controllable semiconductor device, the controllable semiconductor device associated with a first operating parameter and a second operating parameter, wherein at least the first operating parameter is a parameter that is controllable while the controllable semiconductor device is operating;
a first sensor in communication with the controllable semiconductor device, the first sensor acquiring first data relating to the second operating parameter of the controllable semiconductor device; and
a second sensor communication with the controller, the second sensor acquiring second data, the second data comprising at least one of an environmental condition affecting the controllable semiconductor and a mechanical condition affecting the controllable semiconductor;
a controller in communication with the controllable semiconductor device, a storage device, and the first and second sensors, the controller configured to access device data associated with the controllable semiconductor and stored in the storage device, control the first operating parameter of the controllable semiconductor while the controllable semiconductor is operating, and receive first and second data from the first and second sensors, respectively, relating to the second operating parameter and the at least one of mechanical and environmental condition, respectively;
wherein the device data comprises at least one of a default drain to source voltage ($V_{DS}$) boundary, a default power boundary ($P_B$), a default RMS current boundary ($I_{DRMS}$), and a default $R_{DS(on)}$ limited current boundary; and
wherein the controller determines a first predicted value dependent on the device data, compares the data from the first sensor relating to the second operating parameter with the first predicted value, and, if a first condition is detected based on this comparison, the controller dynamically modifies the first operating parameter, while the controllable semiconductor is operating.

34. The device of claim 33, wherein the environmental condition comprises at least one of a temperature, a flow of coolant, and a moisture level.

35. The device of claim 33, wherein the mechanical condition comprises at least one of stress, strain, force, movement, vibration, acceleration, and shock.

* * * * *